(12) United States Patent
Farlow et al.

(10) Patent No.: US 7,758,028 B1
(45) Date of Patent: Jul. 20, 2010

(54) APPARATUS FOR ASSEMBLING PRINTED CIRCUIT BOARDS

(76) Inventors: Douglas T. Farlow, 11873 Calle Parral, San Diego, CA (US) 92128; Thomas Alan Gordon, 15875 Avenida Venusto, Apt. #933, San Diego, CA (US) 92128

( * ) Notice: Subject to any disclaimer, the term of this patent is extended or adjusted under 35 U.S.C. 154(b) by 0 days.

(21) Appl. No.: 11/861,152

(22) Filed: Sep. 25, 2007

Related U.S. Application Data

(60) Provisional application No. 60/826,885, filed on Sep. 25, 2006.

(51) Int. Cl.
*B23Q 1/00* (2006.01)
(52) U.S. Cl. .............................. 269/21; 269/50; 269/53; 269/903; 29/740; 29/559
(58) Field of Classification Search .................. 29/739, 29/740–743, 759, 760, 559, 281.1; 269/20–22, 269/266–269, 903; 361/737, 759, 799, 818; 439/490
See application file for complete search history.

(56) References Cited

U.S. PATENT DOCUMENTS

| | | | | |
|---|---|---|---|---|
| 4,600,231 A | * | 7/1986 | Sickles | 294/161 |
| 5,218,753 A | * | 6/1993 | Suzuki et al. | 29/740 |
| 5,625,941 A | * | 5/1997 | Ozawa | 29/740 |
| 5,897,108 A | | 4/1999 | Gordon et al. | |
| 6,189,876 B1 | * | 2/2001 | Frazier | 269/21 |
| 6,190,997 B1 | * | 2/2001 | Becker et al. | 438/401 |
| 6,394,782 B1 | * | 5/2002 | Grassi | 425/384 |
| 6,898,838 B2 | * | 5/2005 | Gordon | 29/559 |
| 7,160,392 B2 | * | 1/2007 | Shang et al. | 118/728 |

* cited by examiner

*Primary Examiner*—Minh Trinh
(74) *Attorney, Agent, or Firm*—Lewis and Roca LLP

(57) ABSTRACT

An improved vacuum box assembly for use in printed circuit board manufacturing where the printed circuit board is supported during manufacturing operations on the second side of the board. The vacuum box uses a unique and improved side plate that securely retains commercially available substrate support devices within the vacuum box. The side plate has a retention cavity configured to receive one or more substrate support devices therein. The side plate retains the substrate support device in a desired position. Open or unoccupied regions of the retention cavity may be sealed by use of specifically configured vacuum blocking plates.

10 Claims, 19 Drawing Sheets

FRONT VIEW
DOVETAIL CLAMPS

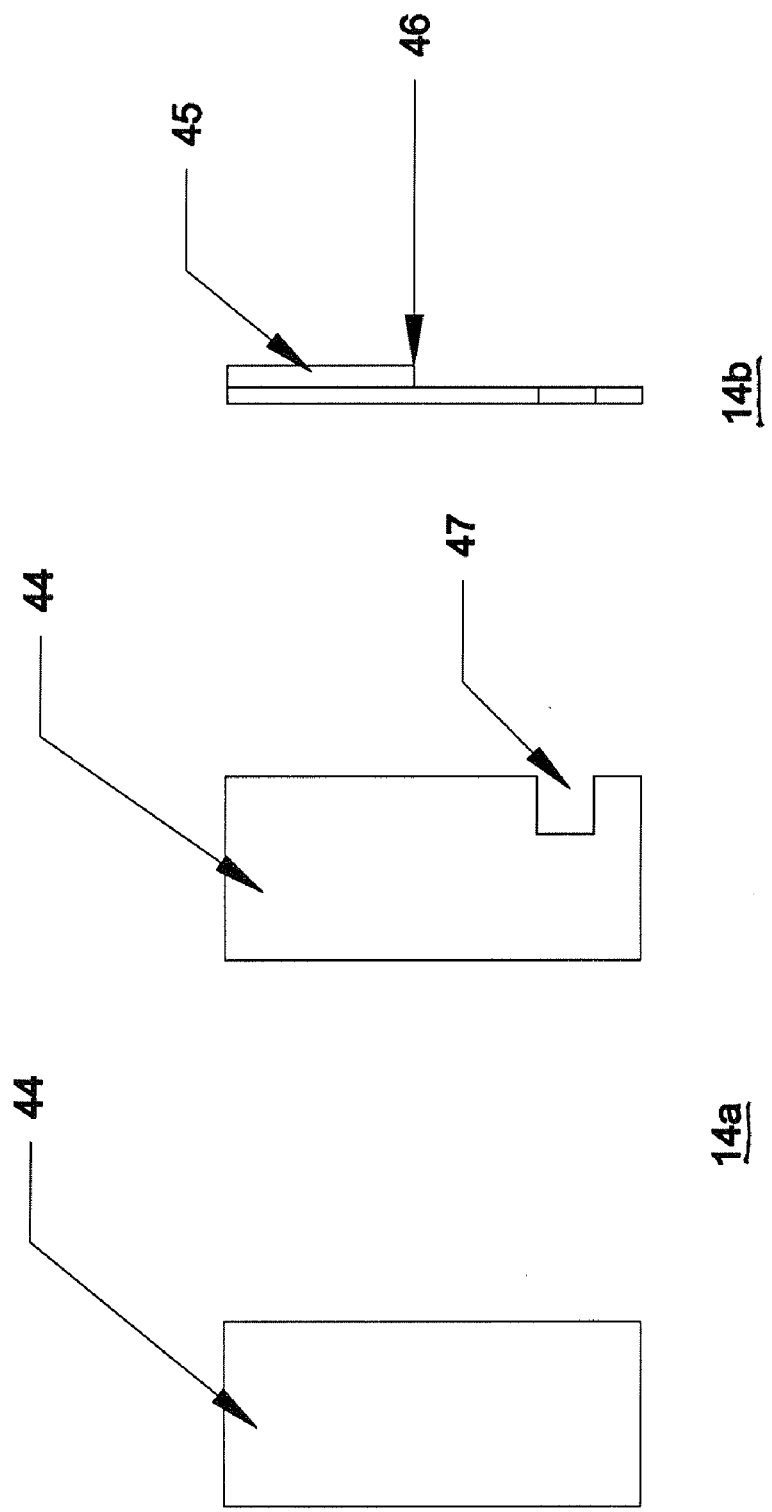

US 7,758,028 B1

APPARATUS FOR ASSEMBLING PRINTED CIRCUIT BOARDS

CROSS REFERENCE TO RELATED APPLICATIONS

The present application claims the benefit of co-pending U.S. Provisional Application Ser. No. 60/826,855, filed Sep. 25, 2006, which is incorporated by reference herein in its entirety.

FIELD OF THE INVENTION

The present invention relates to an apparatus for supporting a printed circuit board or other substrate typically having components mounted on one side during installation of other components on the opposite side. More specifically, the present invention enables the use of one or more substrate support members with known vacuum box assemblies to facilitate printed circuit board manufacturing processes.

BACKGROUND OF THE INVENTION

Printed circuit boards (PCB) have long been used as the base for sophisticated electronic systems. An electrically insulating sheet, originally phenolic impregnated fabrics and now generally fiberglass reinforced resins, is coated with copper cladding and has appropriate patterns etched into the cladding. In years past, most electronic components had wire leads that extended through holes drilled into the cladding pattern and filled with solder to make the required ohmic connections. More recently, surface bonding of relatively short leads to the cladding has become common, allowing for high-speed robotic placement of components thus increasing manufacturing productivity. PCBs typically have components on one side with various height profiles and require even support while manufacturing processes are done to the opposite side such as screen printing and pick-and-place operations.

Industry manufacturing processes for printed circuit boards generally provide that the PCB or substrate be held in place by constructing a vacuum box whose edges correspond to the perimeter edges of the substrate, whereupon the substrate becomes the top lid of the box and is held down or in place by a vacuum. Substrates are typically made of phenolic impregnated fabrics and more recently, fiberglass reinforced resins. Under various manufacturing operations the substrates can flex and frequently require underside support within the constructed vacuum box so that precise placement of components or cladding can be performed.

A vacuum box is commonly used in PCB manufacturing for screen-printing of circuitry or other operations such as component placement (i.e., pick-and-place). The vacuum box is generally an adjustable device that is used to support the PCB during manufacturing. One exemplary vacuum box is manufactured by MPM Corporation and has been used very successfully by the electronics assembly industry, specifically the surface mount technology industry. There are likely over 5000 such vacuum box systems world wide that are used as a means of holding the PCB substrate in place during the screen printing of solder paste onto the PCB substrate and/or component placement. The general configuration and use of a standard vacuum box is described in greater detail below with reference to FIGS. 1a through 7.

The vacuum box 100 is designed to accommodate PCB substrates from about 1.5" to 15.0" wide and up to lengths of 14.5". Referring to FIGS. 1a and 1b, the vacuum box 100 has a table 1 that forms the bottom of the vacuum box 100 with vacuum holes 2 in the table that apply a vacuum capable of retaining the PCB using a large volume of air flow. Under the table 1 is a plenum (not shown) that surrounds the holes in the table 1 and accommodates the ductwork that couples the table 1 with the vacuum source. The table 1 supports a fixed front rail 3 (See also FIGS. 2a and 2b) and a moveable rear rail 4 (See also FIGS. 3a and 3b) that make up two opposing sides (i.e., front and rear) of the box. On each outer side of the front and rear rails 3 and 4 is the conveyor system 5 with conveyor belt 5a, typically placed as close to the front and rear rails as possible, for transporting the PCBs to and from the vacuum box 100.

The front rail 3 (see FIGS. 2a and 2b) is fixed to table 1 by mechanical fasteners 9 and is typically 17" long. At the top of the front rail 3 is a thin blade 6 upon which one edge of the PCB substrate sits, typically along the length of the PCB substrate, and is parallel to the direction of travel for the conveyor system 5.

The rear rail 4 (see FIGS. 3a and 3b) is moveable along slot 7 (see FIG. 1a) in the table 1 and is also 17" long. The slots 7 are usually configured as T-Slots that are configured to receive a mating T-Bolt or threaded fastener for slideably coupling two or more members (i.e., movable rear rail 4 with table 1). The T-Slots 7 of FIG. 1a formed table 1 engage T-Slot nuts and bolts 9, which engage mounting, brackets in the rear rail 4 (see FIG. 3a). In use, the T-Slot nuts 9 are loosened, whereupon the rear rail 4 can be moved and adjusted to the width of the PCB substrate and then tightened to fix the position of the rear rail 4 with respect to the front rail 3.

Similar to the front rail 3, at the top of rear rail 4, is another thin blade 8 upon which the opposite edge of the PCB substrate engages. The thin blade 8 is parallel to the direction of the conveyor system 5 upon which the PCB substrate traverses. The PCB substrate then straddles the two rails (front rail 3 and rear rail 4) with the thin blades 6, 8 supporting the PCB substrate along the length of the PCB edges. It is common for the edges of the PCB to actually protrude past the front and rear edges established by the thin blades 6 and 8 by about 0.100" on each side so that the PCB can engage and ride along the conveyor (See FIG. 6).

The front and rear rails 3 and 4 have clamping rails 10 which engage side plates 11 (See FIGS. 1a, 1b and 4) by way of a clamping block 12. The clamping rail 10 on the front rail 3 is located higher than the clamping rail 10 on the rear rail 4 (see FIGS. 2a and 3a), which in turn requires that four unique side plate configurations be used. The side plates are generally designated front and rear as well as left and right side plates. The industry commonly utilizes side plate nomenclature to designate the operative position of the side plates and this nomenclature is marked on the side plates via stamping or other known marking methods (e.g., screen printing, engraving, etching etc.). Correspondingly, the side plates are marked according to the intended installation position (e.g., LF-left front 11a, LR-left rear 11b, RF-right front 11c, and RR-right rear 11d). The four side plates 11a-d make up the other two opposing sides of the vacuum box 100, with the PCB substrate forming the top or lid. The side plates typically have notches 30 cut into them so that each side plate 11a-d can be drawn as close to the opposite rail (front or rear rails 3 and 4) and thus the notch 30 receives the clamping rail 10 of the opposing front or rear rails 3 and 4. As a result, the side plates 11a-d may be positioned at a minimum separation distance from each other and thus accept a narrow PCB.

The side plates 11a-d (see FIGS. 1a-c and 4-6) have one surface that is generally smooth/flat (i.e., devoid of protrusions on at least one side surface). The front and rear side plates for the vacuum box 100 (e.g., left or right side) are positioned in sliding relationship with respect to each other, see FIGS. 1a-c. The pair of front and rear side plates may then be adjusted to the width of the PCB substrate and thus dimensionally define the distance between the front and rear rails 3 and 4. Additionally, the pair of coupled side plates can be positioned at various distances along the front and rear rails which in turn establishes the length of the PCB substrate. In summary, the two pair of side plates are in sliding relationship with each other as well as adjustable along the length of the front and rear rails which in turn forms a box that is adjustable in both width and length to accommodate various sizes of printed circuit boards.

Referring to FIG. 4, on the opposite side of the side plate 11a is a clamping block 12 that interlocks with the clamping rails 10 of either front or rear rails 3 and 4. The clamping block 12 is securely attached to the side plate 11 usually by screws, pins or combinations of both. A screw 13 at the top of clamping block 12 is tightened which drives a pin 14 into a clamp lip 15, which in turn displaces a clamp lip 15 such that the clamp lip 15 engages a rear notch surface 16 of the corresponding clamp rail 10. The interaction and physical engagement between the clamp lip 15 of the clamping block 12 and rear notch surface 16 of the clamping rail 10, secures the clamping block 12 and side plate 11 in position with respect to the front and rear rails 3 and 4. Reference should be made to FIGS. 5 and 6, which illustrate how the side plates/clamping blocks engage the clamping rail.

Generally, the side plates 11a-d come in several sizes; extra-small, small, medium, large and extra-large that accommodate the various widths of any given PCB substrate up to 15.00" wide. Each size has a corresponding front-left, rear-left, front-right and rear-right side plate and is designated as discussed above. The side plate sizes typically overlap slightly with the next larger size thus allowing for a continuum of PCB widths from the minimum size up to a maximum that may be accommodated within the vacuum box 100. All of the mounting hardware for each size side plate is generally similar. For example, the clamping block 12, screw 13, pin 14 and clamping lip 15 are interchangeable with the various side plates 11. Additionally, it is understood that front-left and front-right side plates are mirror images of each other and the same is true for the rear-left and rear-right side plates.

The side plates 11a-d have a clamping block 12 usually made of stainless steel that engages the clamping rails 10 on the front and rear rails 3 and 4. Correspondingly, the side plates 11a-d may slide along the clamping rail 10 thus allowing the side plates 11a-d to be adjusted to the length of any PCB substrate. The side plates 11 are configured to support the PCB substrate along its width at the front and rear edges of the PCB substrate (with respect to the direction of travel along the conveyor system for the PCB). Additionally, there is little-to-no overhang of the PCB in relation to the side plates 11a-d.

After the front and rear rails 3 and 4 are set and the four side plates 11a-d are clamped down using clamping blocks 12, they form four sides of the vacuum box 100 and support the PCB 33 substrate around its perimeter. The table 1 forms the bottom of the box and the PCB substrate itself forms the lid or top of the vacuum box. Vacuum is then pulled through the holes 2 in the table 1 and suction holds the PCB 33 substrate down against the thin blades 6 and 8 of the front and rear rails 3 and 4 and the side plates 11a-d. The vacuum box 100 essentially forms a cube with, theoretically, no holes or substantial air leaks. However, any given PCB substrate can have numerous holes and slots in them and the vacuum box itself is not airtight. In this regard, to operatively retain the PCB, a large volume of air is drawn in as vacuum to compensate for any leakage in the vacuum box/PCB assembly. Consequently, it is desirable to keep vacuum leakage to a minimum for efficiency concerns.

In operation (see FIG. 6), the table 1, front and rear rails 3 and 4 including side plates 11a-d move up and down to engage the PCB 33. At a predetermined stop point the conveyor 5 with the PCB 33 translating there along, will stop and the vacuum box 100 (the front and rear rails and side plates 11a-d, including the table 1) is raised to engage the PCB 33, lifting the PCB 33 off of the conveyor rails and belts 5, 5a. An upper fixture (not shown) holding a stencil frame 101 and stencil 102 is then lowered onto the PCB 33. Cameras 104, in conjunction with an assembly line computer system, aligns the apertures in the stencil 102 with a corresponding target or "land" pattern on the PCB 33. After alignment, solderpaste is then squeegeed onto the PCB 33 and the stencil 102 is lifted away, leaving a corresponding amount of solderpaste on the PCB. The table 1 and vacuum box 100 assembly then lowers, placing the edges of the PCB 33 (lengthwise) back onto the conveyor belts 5a. The PCB is then shuttled to the next station (typically for pick-and-placement of components), and a new PCB 33 moves into the printer station whereupon the procedure is repeated.

Today, electronic devices are increasingly miniaturized and it has become desirable to mount components on both sides of a PCB. However, there are a number of problems associated with installing parts on the second side after components have been mounted on the first side. For example, the board cannot be held flat with downwardly projecting components of various sizes and thicknesses mounted on the lower side. This problem is most acute when solder paste is to be printed on the second side. During manufacturing, the PCB is required to be held flat and level so that paste application and component placement can be accurately performed upon the second side. This solder paste application and component placement is very difficult if the PCB is not properly secured and held in place.

In the past, several attempts have been made to provide PCB support within the vacuum box so that screen-printing and component placement may be performed. Firstly, in high production run circumstances, aluminum plates or similar materials have been machined in a pattern corresponding to the topography of the first side of the PCB so that components protruding from the first side may pass-through the plate. As a result, the aluminum plate then provides structural support to the PCB during the manufacturing process. This approach is not practical for manufactures or subcontractors producing a limited quantity of printed circuit boards or for boards of vastly different configurations because each PCB design/configuration would require a custom support plate which is expensive and time consuming to machine.

Secondly, internal vacuum box supports have been made by casting a plaster-like material into a mold corresponding to a particular PCB to form a support having pockets for receiving the components on the downwardly extending board side. While effective where a large number of identical boards are to be manufactured, this method is not cost effective where only a few boards are to be made or where custom boards are being manufactured.

Thirdly, during set up of the vacuum box a series of fixed PCB substrate supports have been used that fit between the table surface and the PCB. These supports are usually held to the table by magnets. These supports are typically either pins or blades. The pins are usually about 0.125" to 0.250" in diameter and correspond to the height of the front, rear and side plates and are secured using a magnetic base. The blades are typically 0.050" to 0.0625" thick and up to 2.00" wide and are the same height as the rails and side plates and have a magnetic base. These fixed height supports must be positioned to engage the PCB substrate where no components have been installed otherwise damage to the components may occur during screen-printing or component placement. Also, support can be uneven, and where PCB substrates are populated with a high density of components, it may be very difficult to locate an area that is unpopulated with components.

Fourthly, a series of gel packs 19 were implemented to provide PCB support within the vacuum box, see FIG. 7. The gel packs are essentially packets of gel or other deformable medium that are positioned inside the vacuum box, which conforms to the underside topology of the PCB during printing or component placement. This solution, although somewhat effective, has been less than successful, in that the vacuum box requires the gel packets 19 to be individually constrained using independent mounts 20 to allow vacuum to pass between the individual packets.

Moreover, the gel packs 19 can accommodate component topologies of only limited height. Furthermore, because the gel packets 19 have limited compressibility, they may push the PCB substrate up off the edge(s) of one or more sides of the vacuum box, breaking the vacuum seal and possibly causing misalignment of the PCB registration to the stencil apertures. This is particularly true if a gel packet is under a high profile part, which requires substantial displacement of the gel. In this situation the gel packet 19 would then have to be removed from this position, leaving the PCB substrate unsupported in this area. Conversely, when pressure is applied to the stencil/PCB as the squeegee passes over the substrate, the gel packs 19 may compress and only provide limited support and thus permit the PCB to deflect.

Additionally, the spacing 21 between the gel packets should be optimized such that the majority of the vacuum holes in the table are able to apply vacuum to the PCB. The deficiencies with the gel pack solution can become significant, especially if the PCB substrate is very thin.

Finally, another attempt to provide internal PCB support within the vacuum box uses various substrate support devices placed within the vacuum box, where the support devices provide a plurality of deformable or adjustable pins that conform to the component topology of the PCB. However, this attempt to provide support using such substrate support devices requires that custom devices be manufactured or modified that correspond to the length and/or width of the PCB. Thus, customizing each substrate support device to fit within the perimeter of the front and rear rails 3 and 4 and side plates 11a-d is not cost effective, time efficient or practical unless a manufacturer is only making one size PCB, which is unlikely in the present electronics manufacturing environment. This solution lacks the flexibility that PCB manufacturers need to produce and assemble many different sizes of PCB substrates.

Efforts to provide internal vacuum box support for a printed circuit board, having components mounted on one side while additional components are installed or operations performed on the opposite side, have not met with much success to date.

SUMMARY OF THE INVENTION

The present invention enables the use of commercially available substrate support devices within typical vacuum boxes used during the manufacturing of printed circuit boards by the electronics assembly industry, specifically the surface mount technology industry. Typically, the printed circuit board requires support to prevent flexing during manufacturing operations such as solder paste printing, pick-and-place operations, and any other operation where it is desirable to keep the substrate from flexing.

In accordance with one aspect of the present invention, a side plate for use in a vacuum box is disclosed. The side plate comprising a top edge, a bottom edge, an inside-facing edge, an outside-facing edge, a front surface, a rear surface. A retention cavity extending downwardly from the top edge towards the bottom edge to form a bottom cavity edge, the retention cavity extending from the inside-facing edge towards the outside-facing edge to form a cavity side edge. A retention member movably coupled to the side plate. The retention member comprises a first end, a second end, a top edge, a bottom edge. The first end of the retention member is coupled to the side plate adjacent to the top edge of the side plate and the cavity side edge. The top edge of the retention member is substantially even with the top edge of the side plate.

From a combination aspect of the present invention, there is combined a side plate assembly and a substrate support device. The side plate assembly is configured for use in a vacuum box. The side plate assembly comprises a top edge, a bottom edge, an inside-facing edge, an outside-facing edge, a front surface, a rear surface, a retention cavity extending downwardly from the top edge towards the bottom edge to form a bottom cavity edge.

The retention cavity extends from the inside-facing edge towards the outside-facing edge to form a cavity side edge. The side plate also has a retention member movably coupled to the side plate. The retention member comprises a first end, a second end, a top edge, a bottom edge. The first end of the retention member is coupled to the side plate adjacent to the top edge of the side plate and the cavity side edge. The top edge of the retention member is substantially even with the top edge of the side plate.

The combination also includes a substrate support device positioned in the retention cavity. The substrate support device includes a plurality of displaceable pins, the pins being movable with respect to the substrate support device and retainable in a preset position.

In one embodiment, the side plate is coupled with a clamping block which may also be releasably coupled using at least one magnet. The side plate may further include a support shelf extending perpendicularly away from the side plate, where the support shelf positioned substantially even with the bottom cavity edge. The support shelf may have one or more magnets attached thereon.

In another exemplary embodiment, the side plate may include a retention member that is removable from the side plate. Additionally, the retention cavity may extend from the inside-facing edge towards the outside-facing edge a distance equal to a multiple of a width of a substrate support device. Also the outside-facing edge may substantially follow an inside contour of the vacuum box. The combination may also use pneumatic devices to retain the pins of the substrate support device.

In another exemplary embodiment, the present invention is a method of configuring a vacuum box for use in manufacturing printed circuit boards. The method has a first step of providing a vacuum box comprising a front rail, a rear rail, a table, a first set of side plates, a second set of side plates, the first and second set of side plates each having a retention member and a retention cavity. Secondly, the method has a step of adjusting the vacuum box to substantially match a perimeter of a printed circuit board by establishing distances between the front rail, the rear rail, the first set of side plates and the second set of side plates. The method continues by positioning at least one retention member to expose the retention cavity and placing at least one substrate support device across the first and second sets of side plates. The next step is positioning at least one retention member to retain the at least one substrate support device within the retention cavity. Finally, the method concludes with the step of securing the at least one substrate support device with respect to the vacuum box.

An alternate embodiment includes the step of installing at least one vacuum blocking plate to minimize a vacuum leak within the vacuum box. The method may further include a step of installing at least one dovetail clamping bracket and/or bridge member to retain the at least one substrate support device within the vacuum box.

For a fuller understanding of the nature and advantages of the present invention, reference should be made to the ensuing detailed description and claims, taken in conjunction with the accompanying drawings.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 1b is an isometric view of the typical vacuum box substrate support system shown in FIG. 1a;

FIG. 1c is an isometric view of two sets of side plates as utilized in the typical vacuum box substrate support system shown in FIG. 1a;

FIG. 2a is a front view of a front rail assembly of the vacuum box of FIG. 1a;

FIG. 2b is a side view of a front rail assembly of the vacuum box of FIG. 1a;

FIG. 3a is a front view of a rear rail assembly of the vacuum box of FIG. 1a;

FIG. 3b is a side view of a rear rail assembly of the vacuum box of FIG. 1a;

FIG. 14a is front view of a vacuum blocking plate in accordance with the present invention; and FIG. 14b is a side view of the vacuum blocking plate of FIG. 14a.

DETAILED DESCRIPTION OF THE INVENTION

The present invention enables the use of commercially available substrate support devices with standard vacuum boxes commonly used in the electronics assembly industry. In the following description, numerous specific details are set forth in order to provide a more thorough description of the present invention. It will be apparent, however, to one skilled in the art, that the present invention may be practiced without these specific details. Other embodiments of the invention will readily suggest themselves to such skilled persons having the benefit of this disclosure. In some instances, well-known features have not been described in detail so as not to obscure the invention.

Figure 1A:
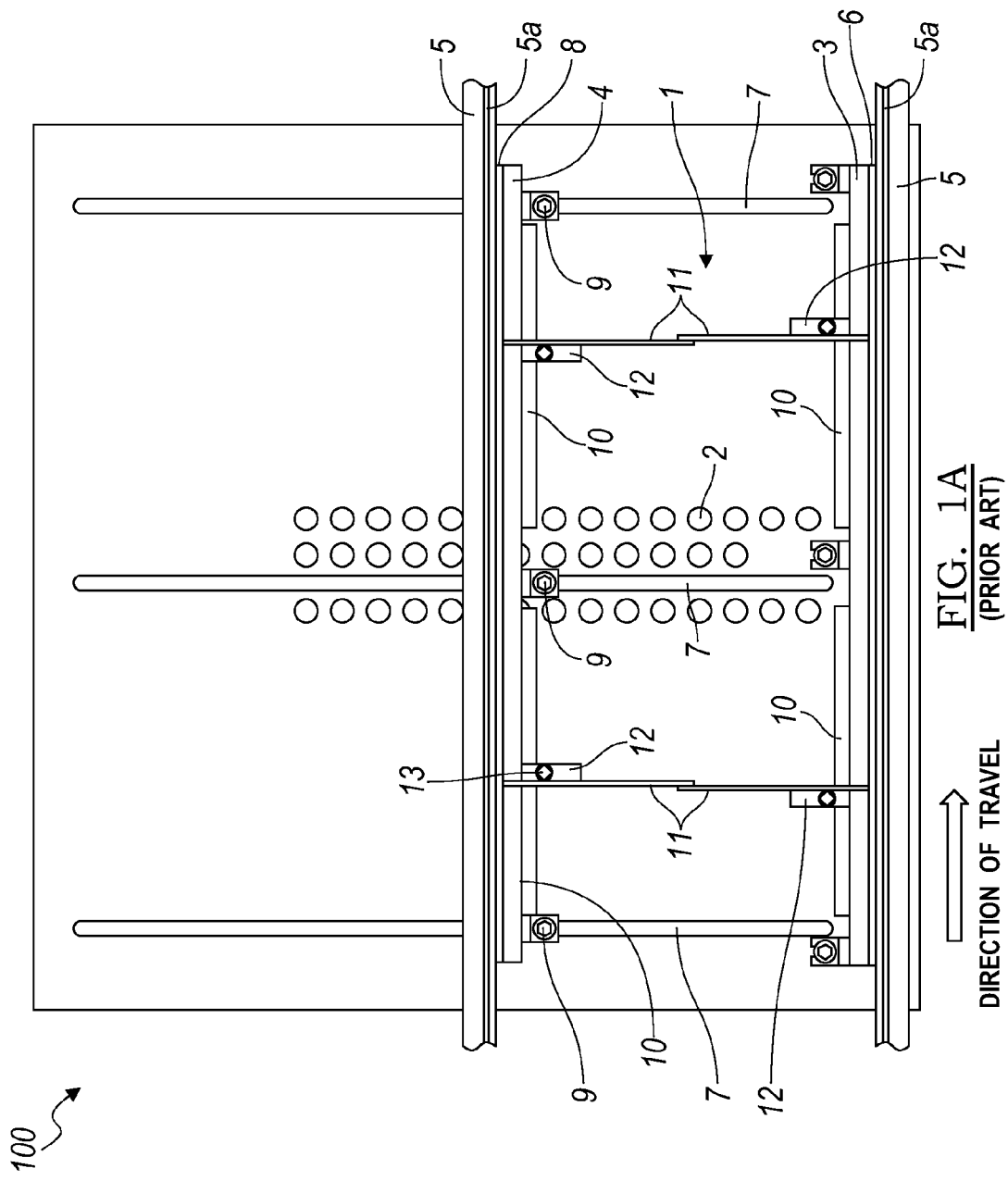
FIG. 1a is a top view of a typical vacuum box substrate support system.
Figure 1B:
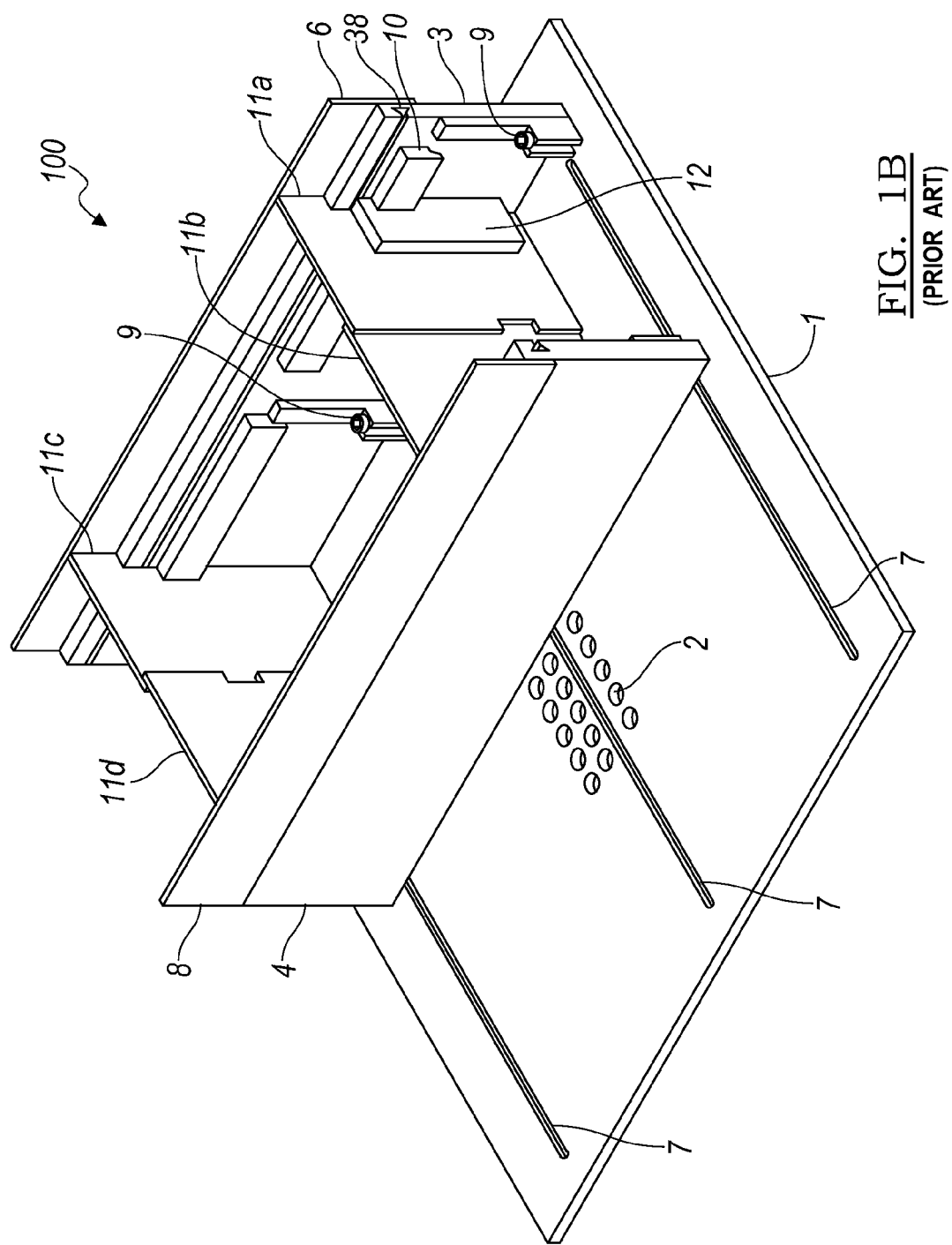
Figure 1C:
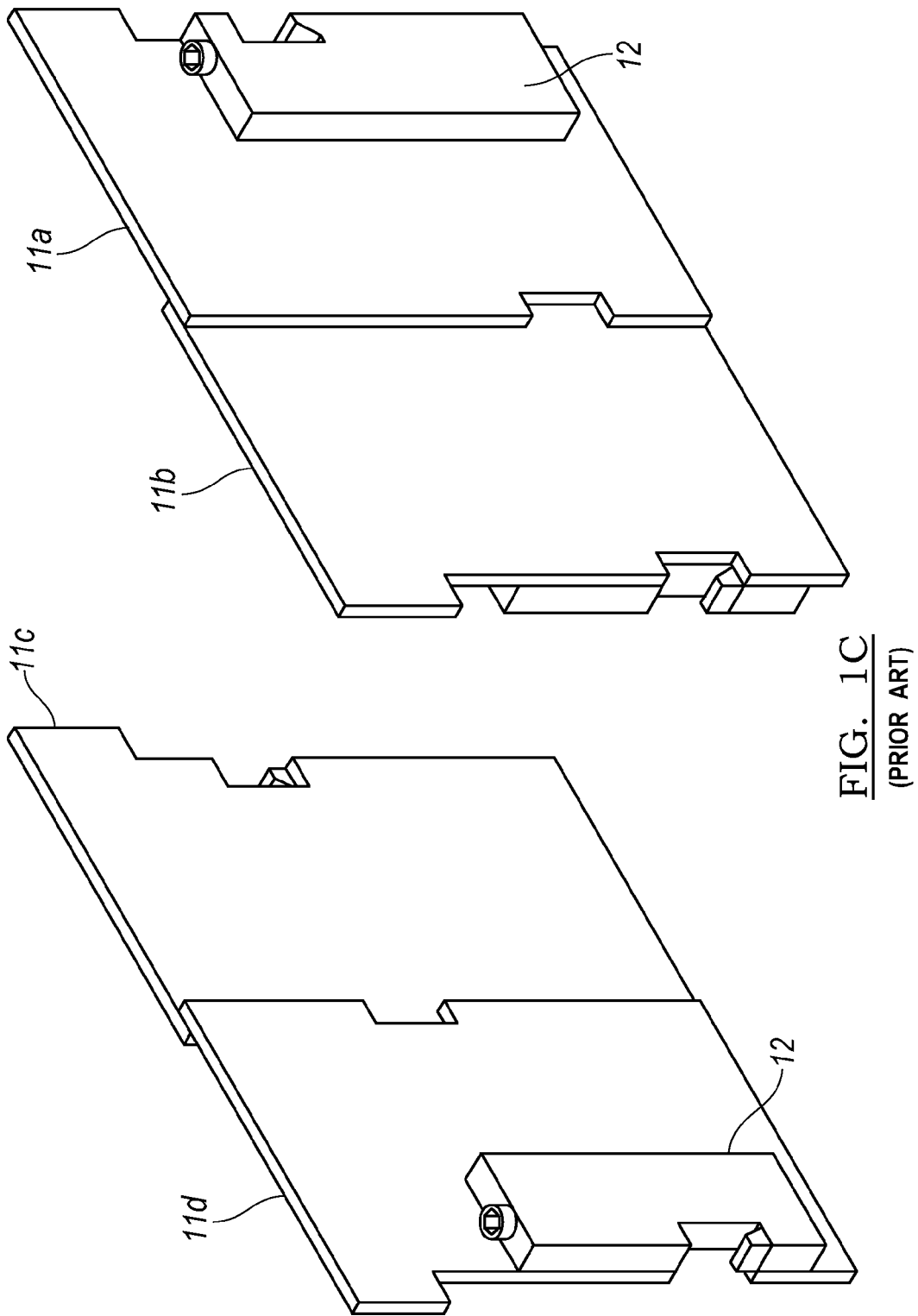
Figure 2:
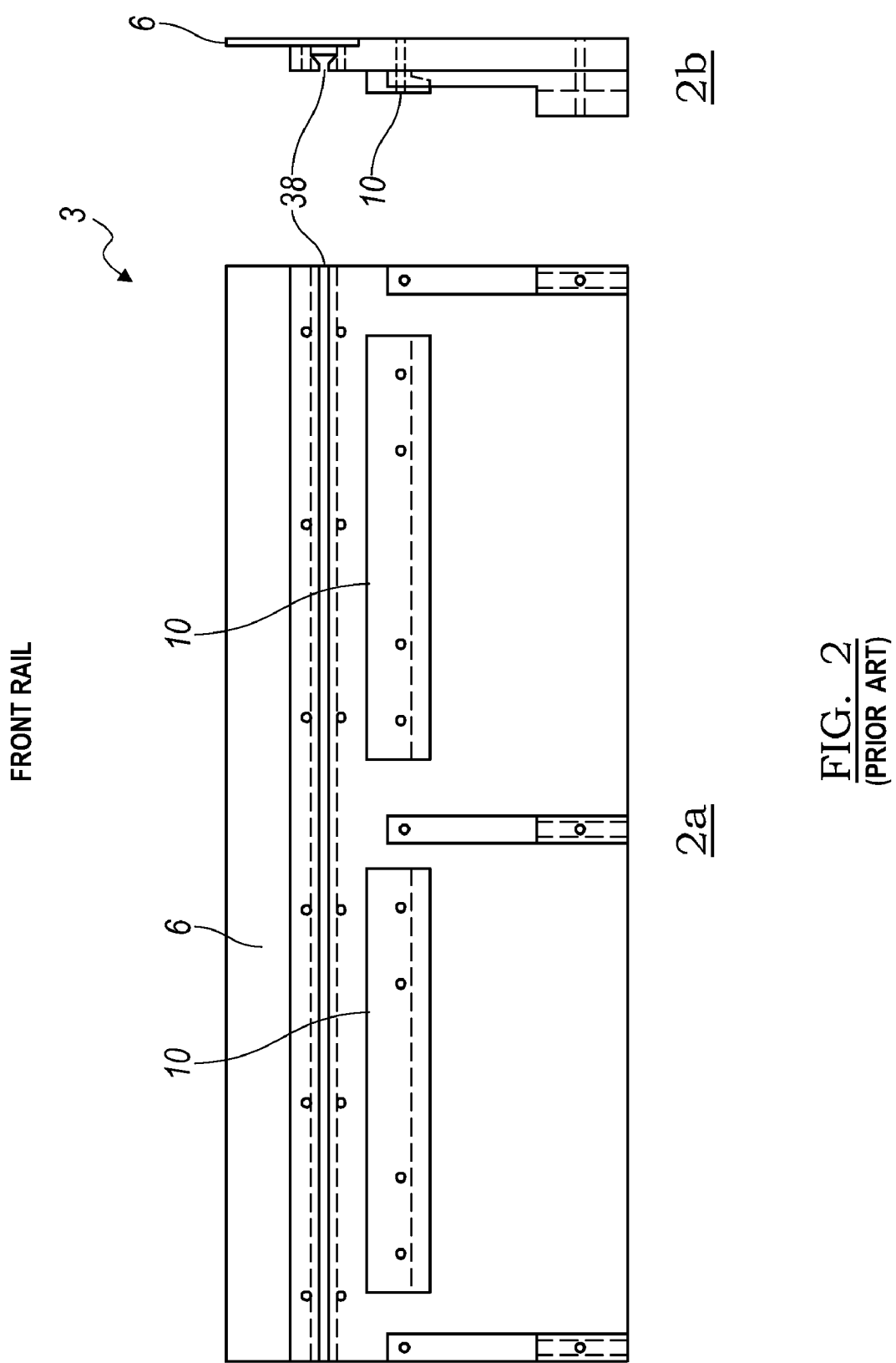
Figure 3:
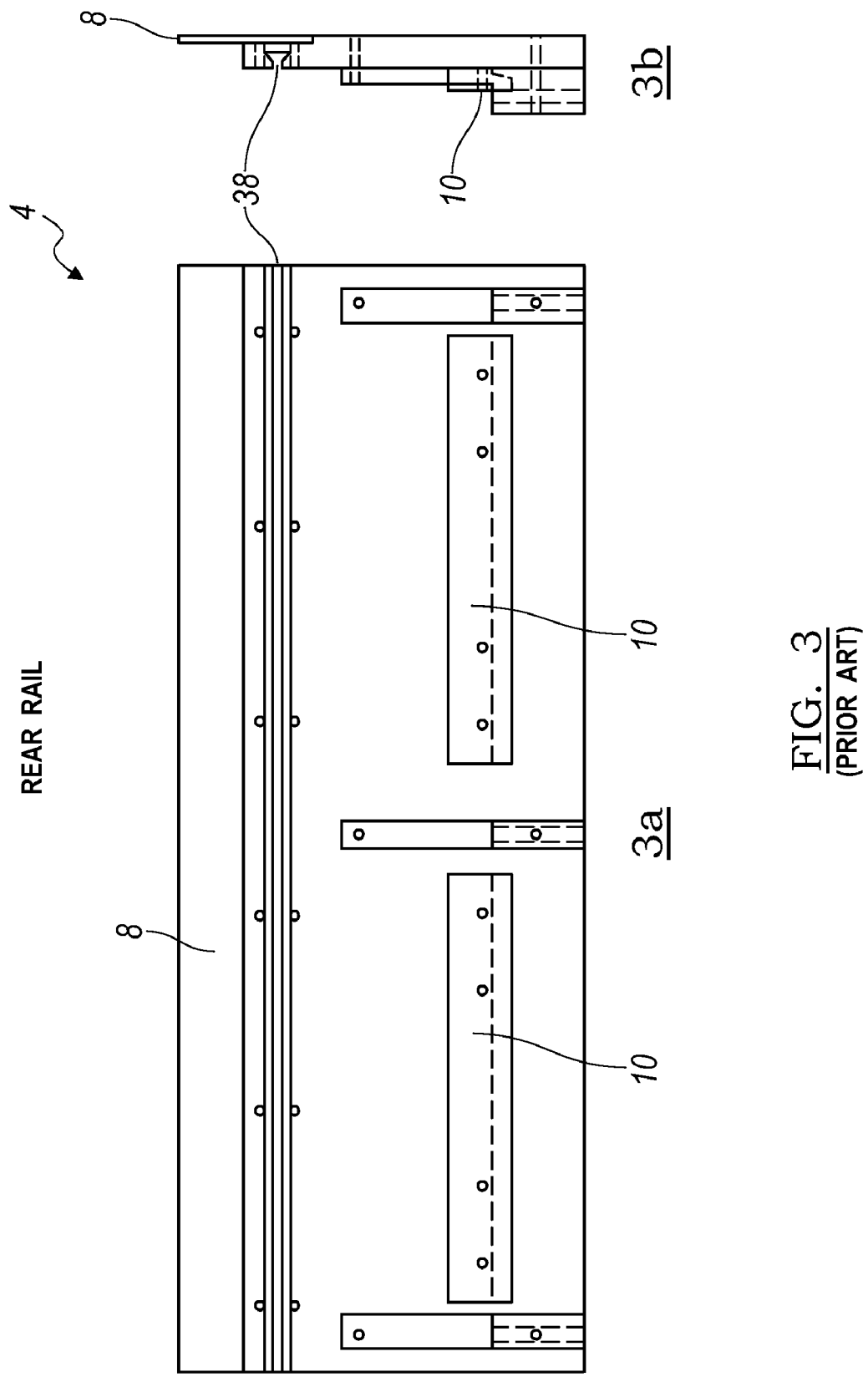
Figure 4:
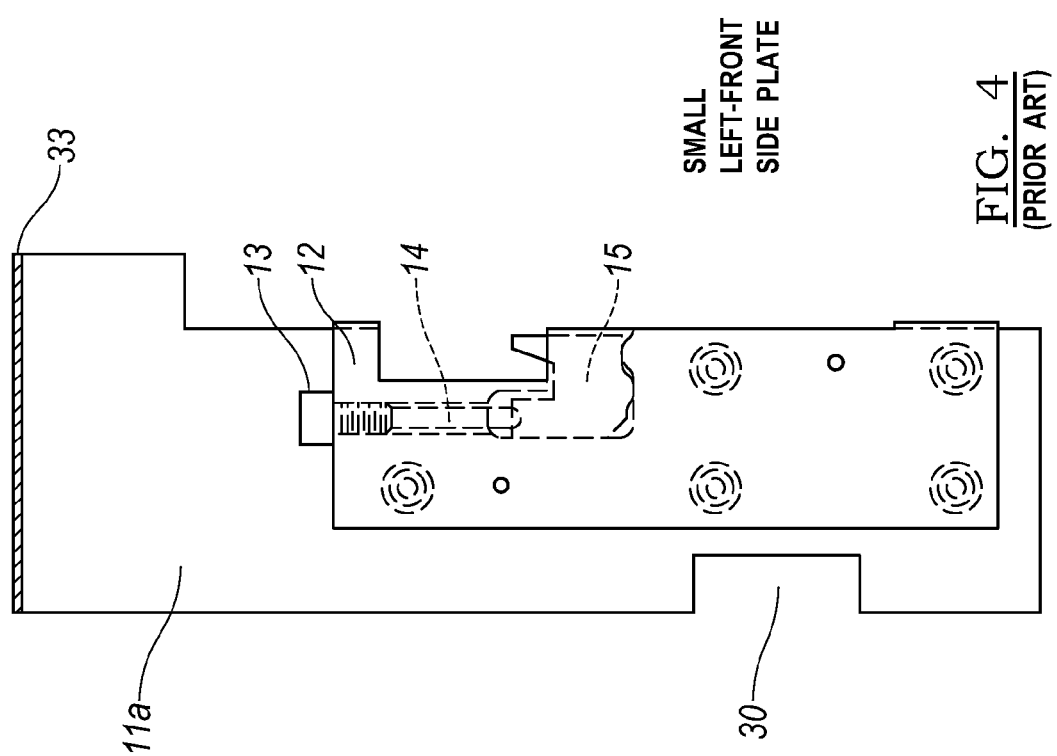
FIG. 4 is a side view of a left front side plate of the vacuum box of FIG. 1b
Figure 5:
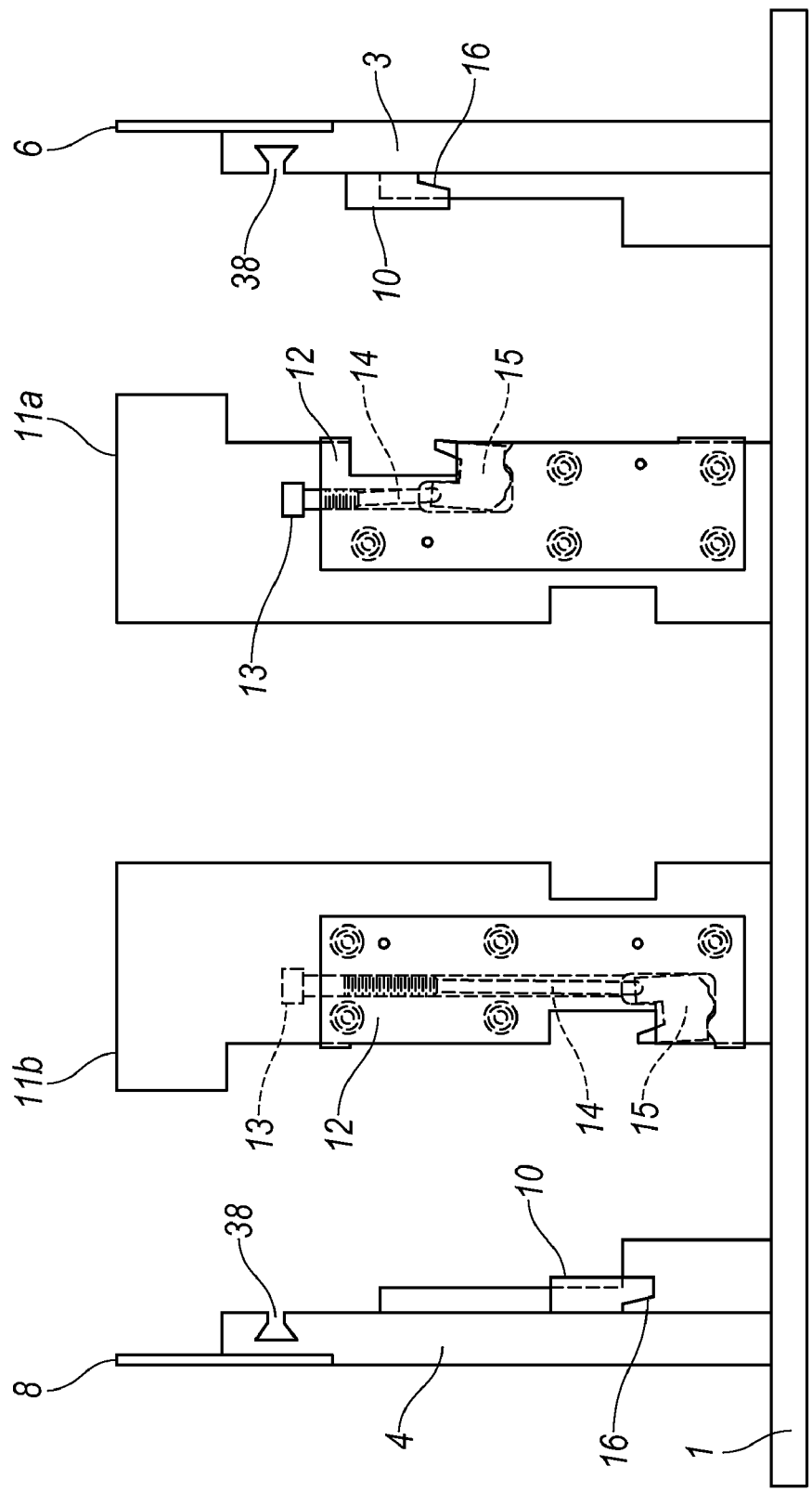
FIG. 5 is an exploded side view of the vacuum box assembly of FIG. 1b.
Figure 6:
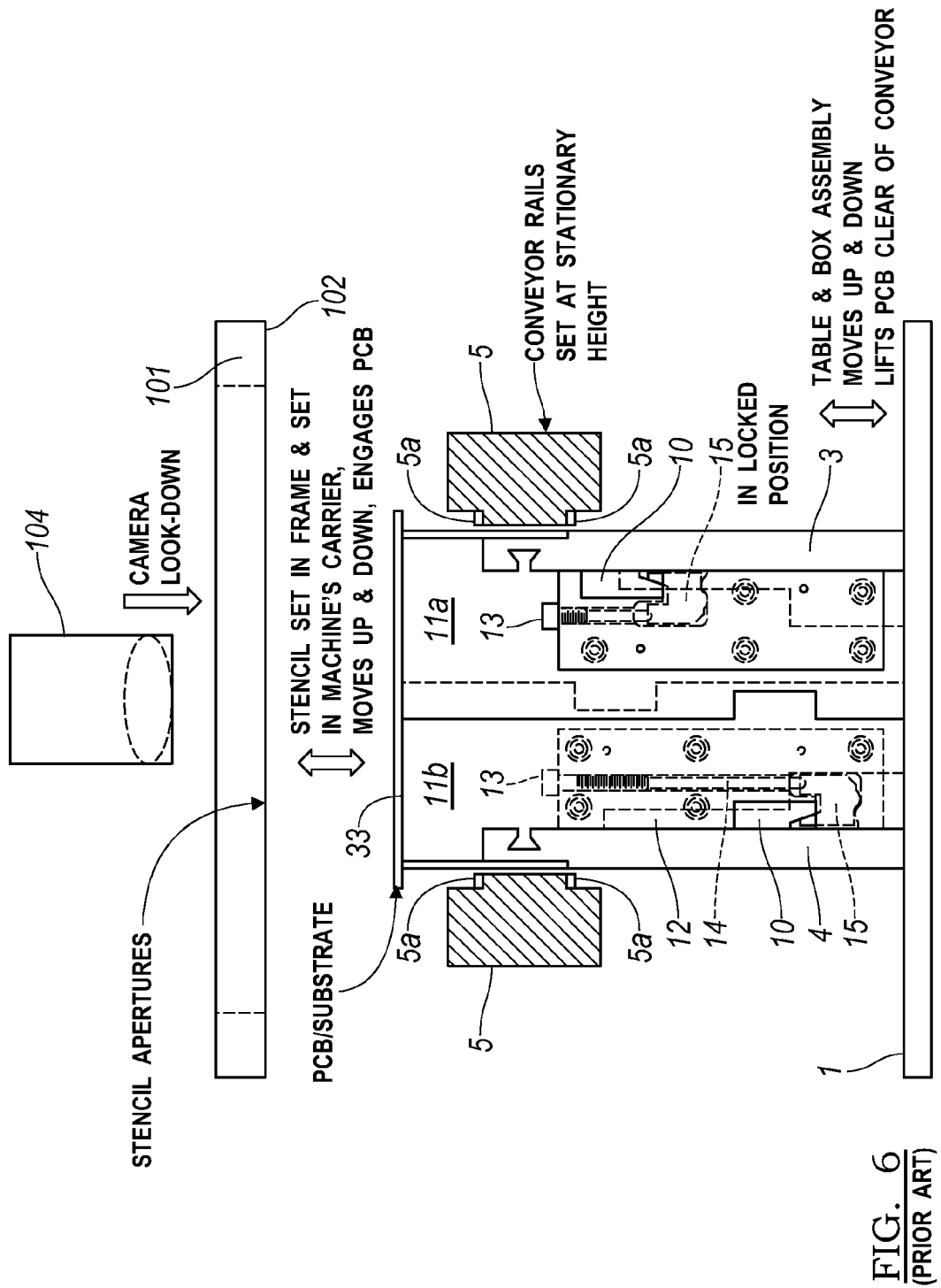
FIG. 6 is a side view of the vacuum box assembly of FIG. 1b.
Figure 7:
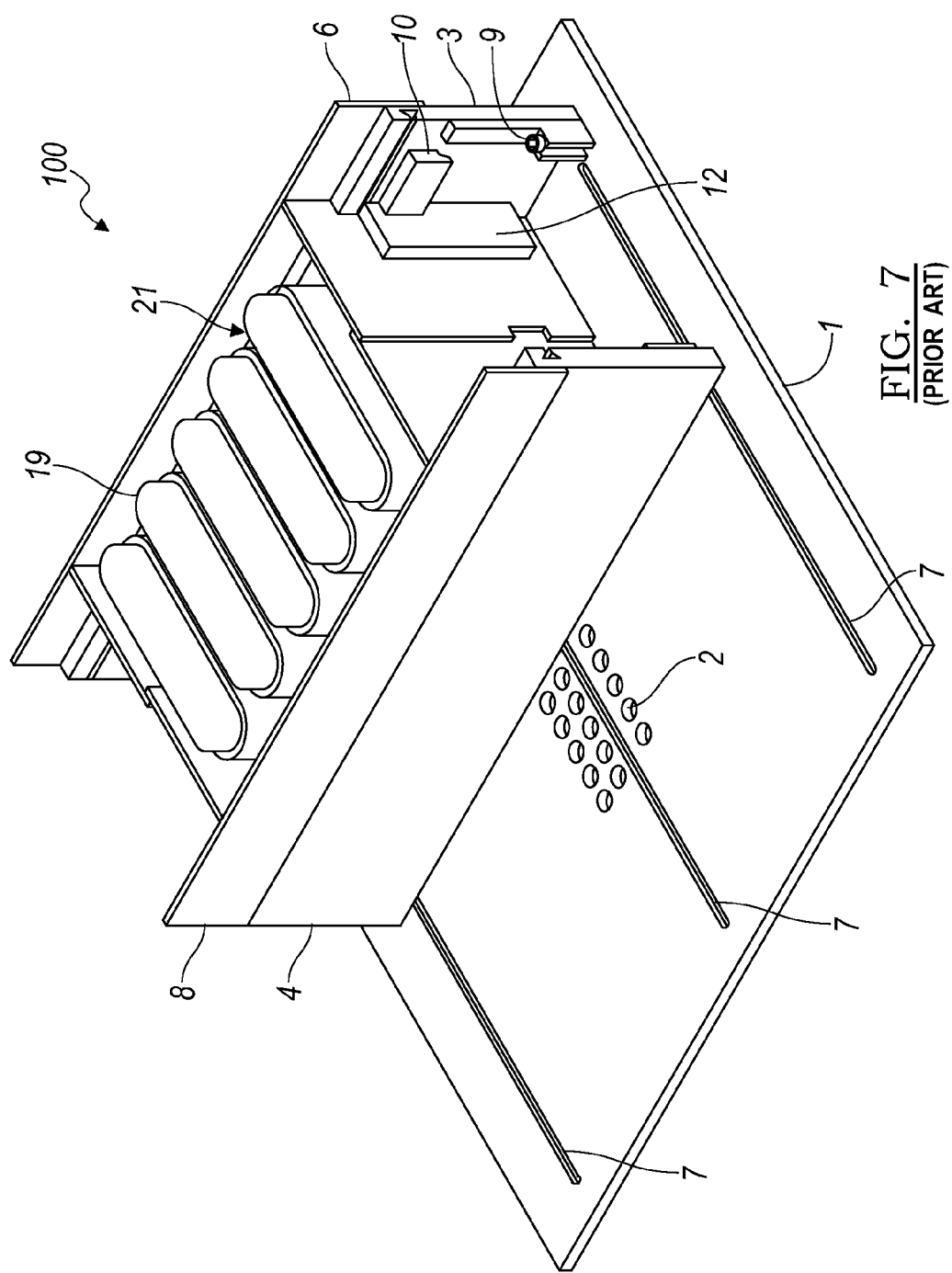
FIG. 7 is an isometric view of the vacuum box assembly of FIG. 1b using a plurality of gel packs for substrate support.
Figure 8:
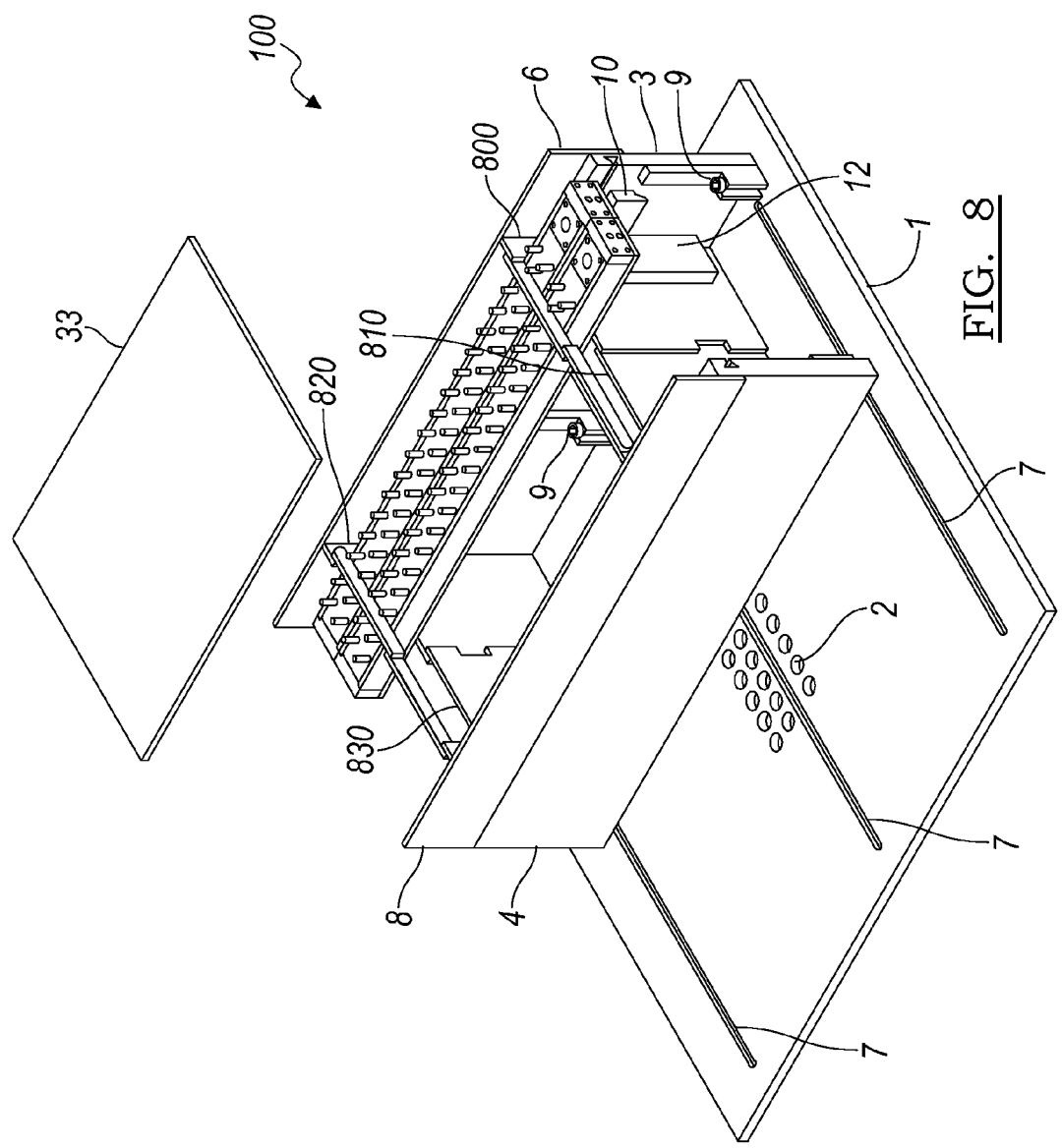
FIG. 8 is an isometric view of one embodiment of a vacuum box assembly in accordance with the present invention.

Turning now to FIG. 8 which illustrates a vacuum box 100 having a front rail 3, a rear rail 4, a left-front side plate 800, a left-rear side plate 810, a right-front side plate 820, a right-rear side plate 830, a substrate support device 840 and a clamping block 12 affixed to each side plates 800, 810, 820, 830. The front and rear rails 3 and 4, clamping blocks 12 and general vacuum box operation has been discussed and described in detail above and is not repeated to avoid undue prolixity. It is contemplated that the vacuum box 100 may be used with or without the application of vacuum to support the printed circuit board during manufacturing processes.

The substrate support device 840 is generally a strip comprising a plurality of movable/deformable pins that conform to the topology of a printed circuit board (PCB) and spans the distance between the left (800, 810) and right (820, 830) sets of side plates. One exemplary substrate support device 840 (known in the industry as "Red-E-Set") is manufactured by Production Solutions, Incorporated of Poway, Calif. The "Red-E-Set is generally about 1.25" in width, 18.50" in length and 1.50" in height. This version of the substrate support device 840 was originally disclosed in U.S. Pat. No. 5,897,108, entitled Substrate Support System, issued to Gordon et al., on Jan. 26, 1998, the disclosure of which is incorporated by reference herein in its entirety.

The substrate support device 840 fabricated according to U.S. Pat. No. 5,897,108 is an apparatus that has a plurality of pins arranged in an array or matrix. The pins are spring loaded and able to move up and down within a housing and thereby conform to the topology of a PCB/substrate surface. The pins are locked into position by a series of plates that move in relation to each other. Such an arrangement is disclosed in U.S. Pat. No. 5,897,108, which describes a series of plates with aligned holes through which the spring-loaded pins protrude. A top plate and a bottom plate hold the pins in position laterally, while a middle plate is moved out of alignment to clamp the pins, thus holding the pins in vertical alignment to the underside topology of the substrate. There are several means that may be used to move or displace the middle plate. For example, the middle plate may be displaced by mechanical means such as a treaded member, a gear driven member, or a cam driven member. Other mechanisms such as pneumatic devices, hydraulic chambers, electro-mechanical devices, electronic solenoids or combinations thereof may be implemented as the mechanical displacement means. Furthermore the mechanical displacement means may be actuated either manually or automatically. However, it is contemplated that other mechanical displacements means are possible and would be readily appreciated and understood by one of ordinary skill in the art.

Figure 9A:
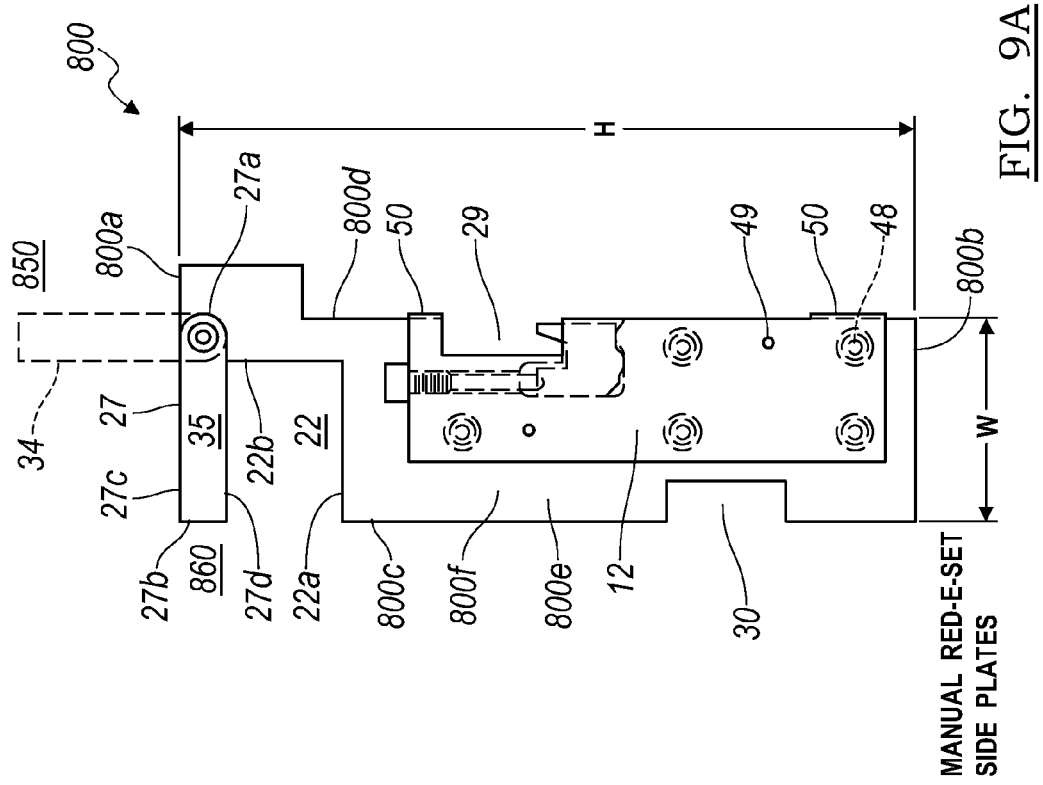
FIG. 9a is a side view of one embodiment of a side plate in accordance with the present invention.

A side plate 800 is shown in FIG. 9a, which is configured to retain one or more substrate support devices 840 adjacent to an upper region of the side plate. It should be understood that the left and right side plate pairs are mirror images of each other. Furthermore, the structure, configuration and operation of the side plates will be discussed and described in detail with reference to one plate (left-front 800), however the following disclosure is applicable to the other side plates 810, 820 and 830.

The left-front side plate 800 has a top edge 800a, a bottom edge 800b, an inside-facing edge 800c, an outside-facing edge 800d, a front surface 800e and a rear surface 800f. The inside-facing edge 800c is generally orientated towards the center most region of the vacuum box 100. Conversely, the outside-facing edge 800d is configured to contour the inside surface of the front rail 3. The left-front side plate 800 generally defines a rectangular plate having an over height "H," width "W" and thickness "T." The height of the side plate 800 is substantially similar to the height of the front rail 3.

The width of the side plate 800 may vary according to the size of the PCB/substrates that are being produced. It is contemplated that the side plate 800 may come in small, medium, large and extra-large widths that would retain from one to several substrate support devices 840. For example, a small side plate would retain one to two substrate support devices; a medium side plate would accommodate one to three devices; a large side plate would retain one to seven devices and an extra-large side plate could accommodate one to ten substrate support devices 840. In one embodiment, the size (width) of the side plate is generally a multiple of the width of a substrate support device 840. However, it is contemplated that other variations are possible and would be readily appreciated and understood by one of ordinary skill in the art subsequent to reviewing this disclosure.

Figure 9B:
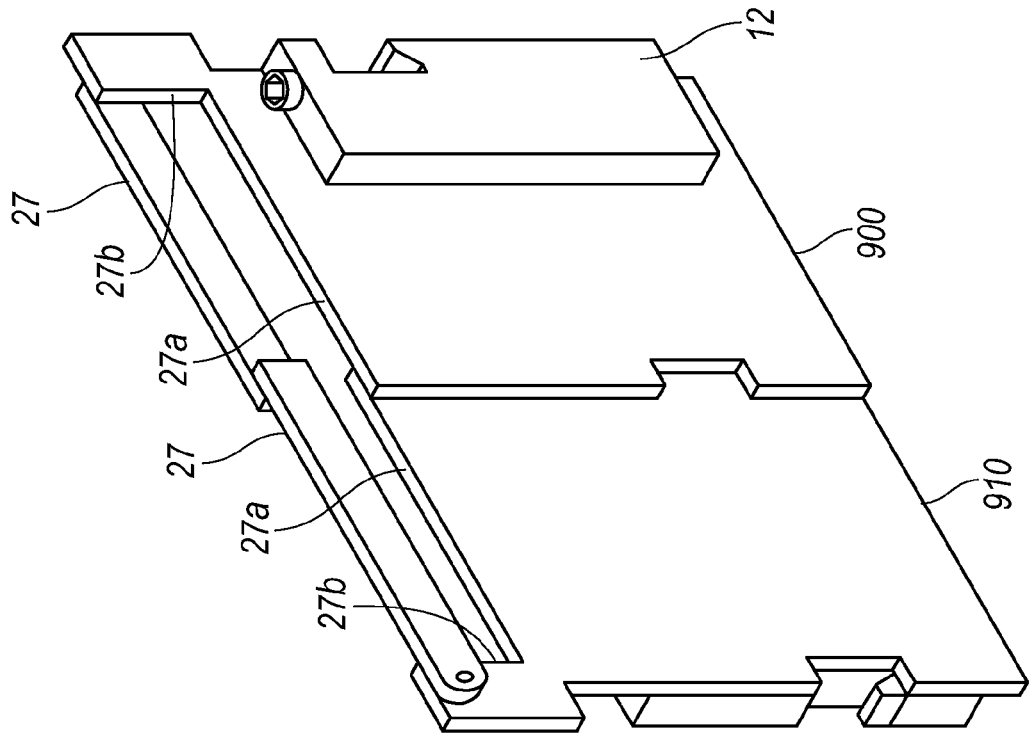
FIG. 9b is an isometric view of two sets of side plates in accordance with one embodiment of the present invention.
Figure 9B:
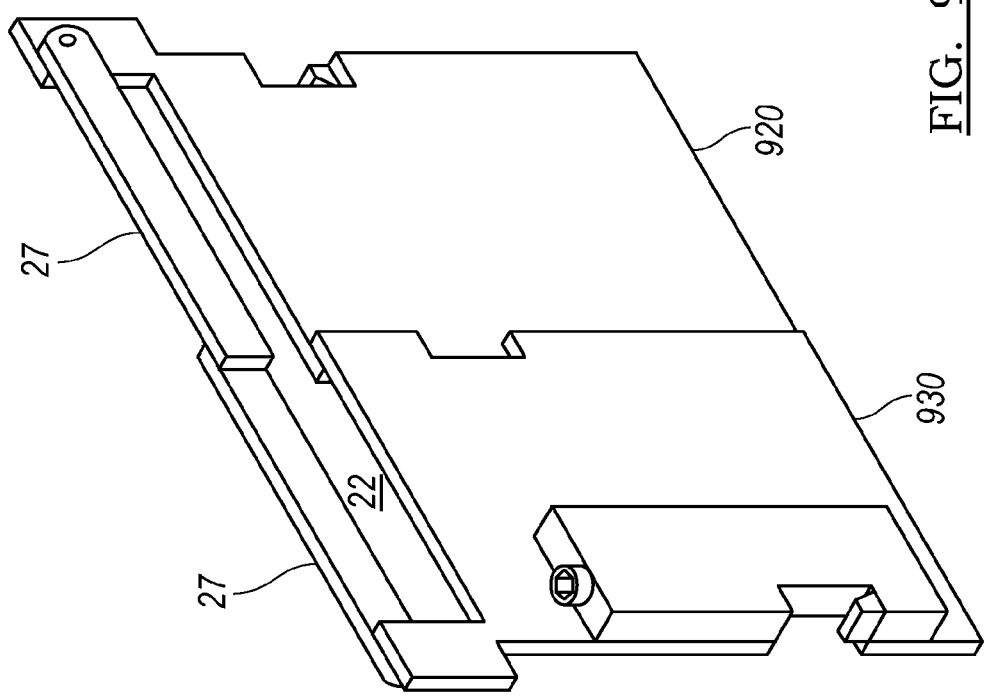

FIG. 9b illustrates two sets of extra-large side plates arranged in sliding relationship with one another. As illustrated, there is a left-front side plate 900, a left-rear side plate 910, a right-front side plate 920 and a right-rear side plate 930. The extra-large side plates 900-930 have been configured to retain and support one to ten substrate support devices and correspondingly have a width that is greater than the small side plate 800 of FIG. 9a.

The thickness of the side plate 800 is generally defined from the material from which the side plate is fabricated. In one embodiment, the side plate 800 is fabricated from martensitic (magnetic) stainless steel and may range from 0.010"-0.060" in thickness. However, one of ordinary skill in the art of machine design would appreciate that other suitable materials may be used to fabricate the side plate. For example, galvanized steel of various thicknesses may be used as well as polymers or composite/laminate sheets.

As illustrated in FIG. 9a, the outside-facing edge 800d of the left-front side plate 800 has a first receiving notch 29 formed thereon. The first receiving notch 29 is positionally located to receive the clamping rail 10 of the front rail 3. For the rear side plates (810, 830) the first receiving notch 29 may be located lower than the first receiving notch for the front side plates (800, 820). It is contemplated that the first receiving notch 29 for the relevant side plate be located to adequately receive the respective clamping rail to which the side plate will be attached. The first receiving notch 29 is further configured to align with the operative mechanism of the clamping block 12 that is coupled to the left-front side plate 800.

The clamping block 12 is aligned with the first receiving notch 29 and mounted to the front surface 800e of left-front side plate 800 using mechanical fasteners such as threaded members 48, pins 49, rivets, magnets, adhesives or other mechanical fastening means now known or later developed. In one embodiment, it is contemplated that the clamping block 12 is releasably coupled with the left-front side plate 800 so that different width left-front side plates may be independently attached to the same clamping block 12. As a result, a user is enabled to use one clamping block 12 with several different side plates. This reduces the number of clamping blocks a user has to have in inventory and provides increased flexibility in the manufacturing process.

Also illustrated in FIG. 9a is a second receiving notch 30 formed on the inside-facing edge 800c of the left-front side plate 800. The second receiving notch 30 is positionally located to receive the clamping rail 10 of the opposing rear rail 4. For the rear side plates (810, 830) the second receiving notch 30 may be located higher than the notch for the front side plates (800, 820). It is contemplated that the second receiving notch 30 for the relevant side plate be located to adequately receive the opposite clamping rail therein. The second receiving notch 30 allows the side plates to substantially overlap each other and thus obtain a minimum width for accommodating small PCBs/substrates.

Further illustrated in FIG. 9a, is a substrate support device receiving cavity 22 formed within the left-front side plate 800. The receiving cavity 22 is a notch or cutout that extends from the inside-facing edge 800c towards the outside-facing edge 800d of the left-front side plate 800 to form a bottom cavity edge 22a. The receiving cavity 22 also extends from the top edge 800a towards the bottom edge 800b of the left-front side plate 800 to form a cavity side edge 22b.

The receiving cavity 22 is generally configured to accept one or more substrate supporting devices 840. The distance the receiving cavity 22 extends from the inside-facing edge 800c is a function of the overall width "W" of the particular side plate configuration (i.e., small, medium, large or extra-large side plate). The distance the receiving cavity 22 extends from the top edge 800a is dependent upon the height and configuration of the particular substrate support device 840 utilized. However, it is preferred that the substrate support device 840 be positioned so that the pins of the device partially extend above the top edge 800a of the side plate to thereby guarantee that, in use, the PCB substrate fully engages the pins of the substrate support device 840.

Adjacent to the top edge 800a and cavity side edge 22b is pivotally attached a retention member 27. In one embodiment, the retention member 27 is pivotally attached to the side plate using a rivet, however other means for pivotal connection are possible such as threaded members, bushing, bearings, pins or combinations thereof. The retention member 27 is a drawbridge or gate that provides access and retention means for one or more substrate support devices 840. The retention member 27 has a first end 27a, a second end 27b, a top edge 27c and a bottom edge 27d. The retention member 27 substantially extends from the cavity side edge 22b towards the inside-facing edge 800c of the side plate 800. In one embodiment, the retention member 27 does not extend all the way to the inside-facing edge 800c and thus provides a region of clearance for an opposing side plate. The first end 27a of the retention member 27 may be rounded so that when the retention member 27 is rotated the corners of the first end 27a do not extend above the top edge 800a of the side plate 800.

The rounded first end 27a allows the retention member 27 to rotate below the plane established by the top edges of the side plate/vacuum box without interfering with the placement of the PCB substrate.

In another exemplary embodiment, the retention member 27 may be removably attached to the side plate. For example, the retention member 27 is removed so that the substrate support device 840 can be positioned and then the retention member 27 is reinstalled. In this embodiment, the retention member 27 may be removably secured to the side plate by various means such as a tongue and grove configuration; a dovetail joint; a mortise and tenon arrangement or other designs that provide removable placement of the retention member 27.

In accordance with the present invention, the retention member 27 is movable between a first position 850 and second position 860. In the first position 850, the retention member 27 is rotated or moved such that convenient access to the retention cavity 22 is permitted. For example, the retention member 27 may be rotated into a vertical orientation so that one or more substrate support devices 840 may be positioned on the bottom cavity edge 22a and span across the side plates.

In the second position 860 (horizontal orientation), the retention member 27 is rotated or moved such that bottom edge 27d of the retention member 27 may engage or rest on the substrate support device 840 and the top edge 27c of the retention member 27 is substantially event with the top edge 800a of the side plate 800. Consequently, the top edges 27c and 800a of the retention member and side plate form a combined edge that supports the width of the PCB substrate. Additionally, the pins of the substrate support device 840 will provide support along retention member 27. The retention member 27 also provides substantial vacuum blocking in the second position 860.

In one embodiment, the retention member 27 is fabricated from martensitic (magnetic) stainless steel. In one non-limiting example, the retention member may range from 0.010"-0.060" in thickness. However, one of ordinary skill in the art would appreciate that other suitable materials and thicknesses may be used to fabricate the retention member 27. For example, galvanized steel of various thicknesses may be used as well as polymers or composite/laminate sheets.

There are several types of adjustable substrate support devices 840 commercially available to the electronics assembly industry, specifically the surface mount technology industry. The adjustable substrate support devices 840 generally fall into two classifications manual or automated. The manual substrate support devices typically require actuation of a mechanism to lock the support pins in place. The actuation usually requires turning and/or torquing a screw, cam or lever associated with the substrate support device. Consequently, this manual actuation may cause the substrate support device to shift or move with respect to placement within the side plate/vacuum box assembly. In response to this situation, the present invention provides mechanical means for securing the substrate support device within the vacuum box assembly.

Figure 10:
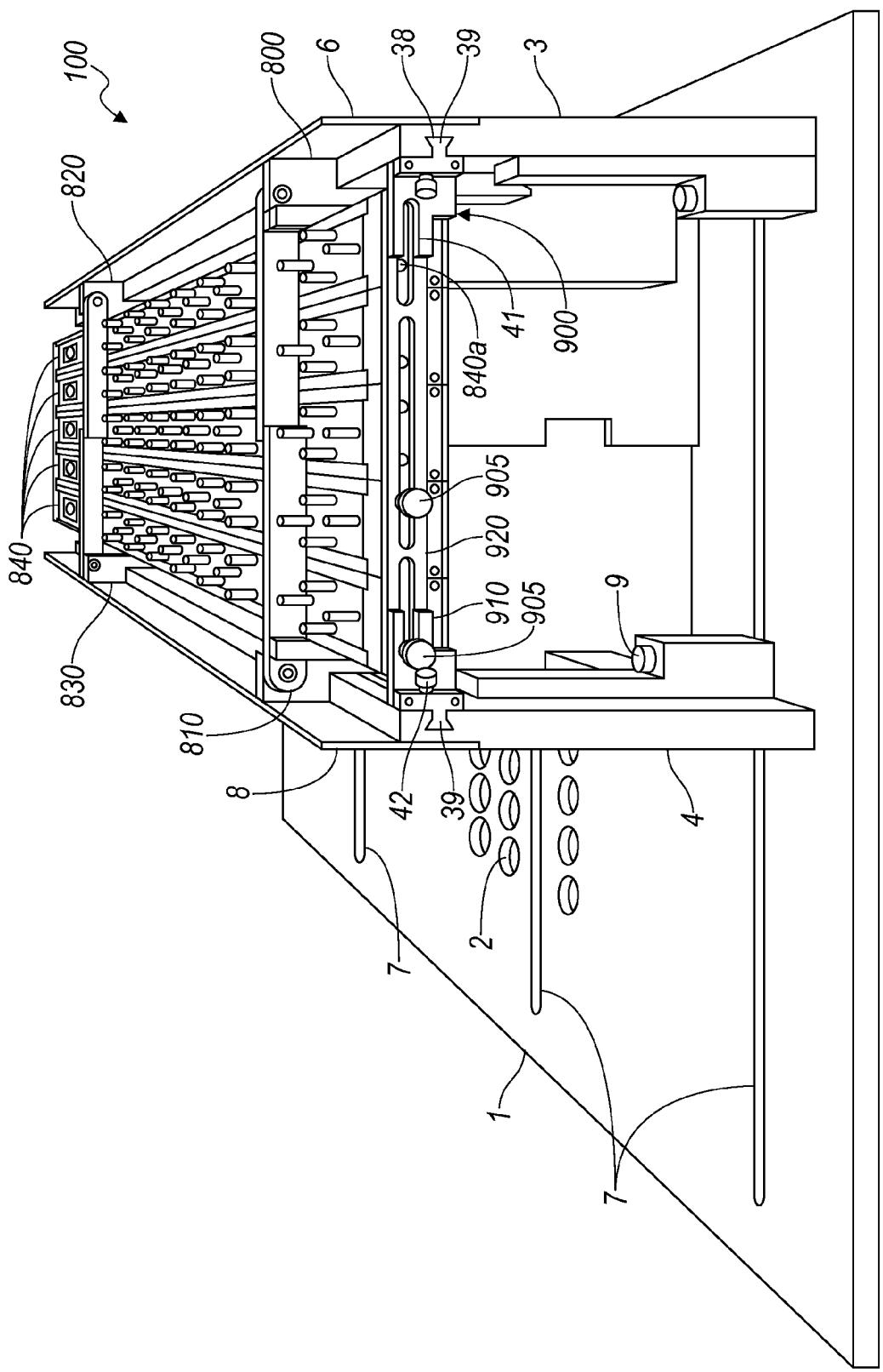
FIG. 10 is a perspective side view of one embodiment of a vacuum box assembly illustrating the dovetail clamping brackets in accordance with the present invention.
Figure 11:
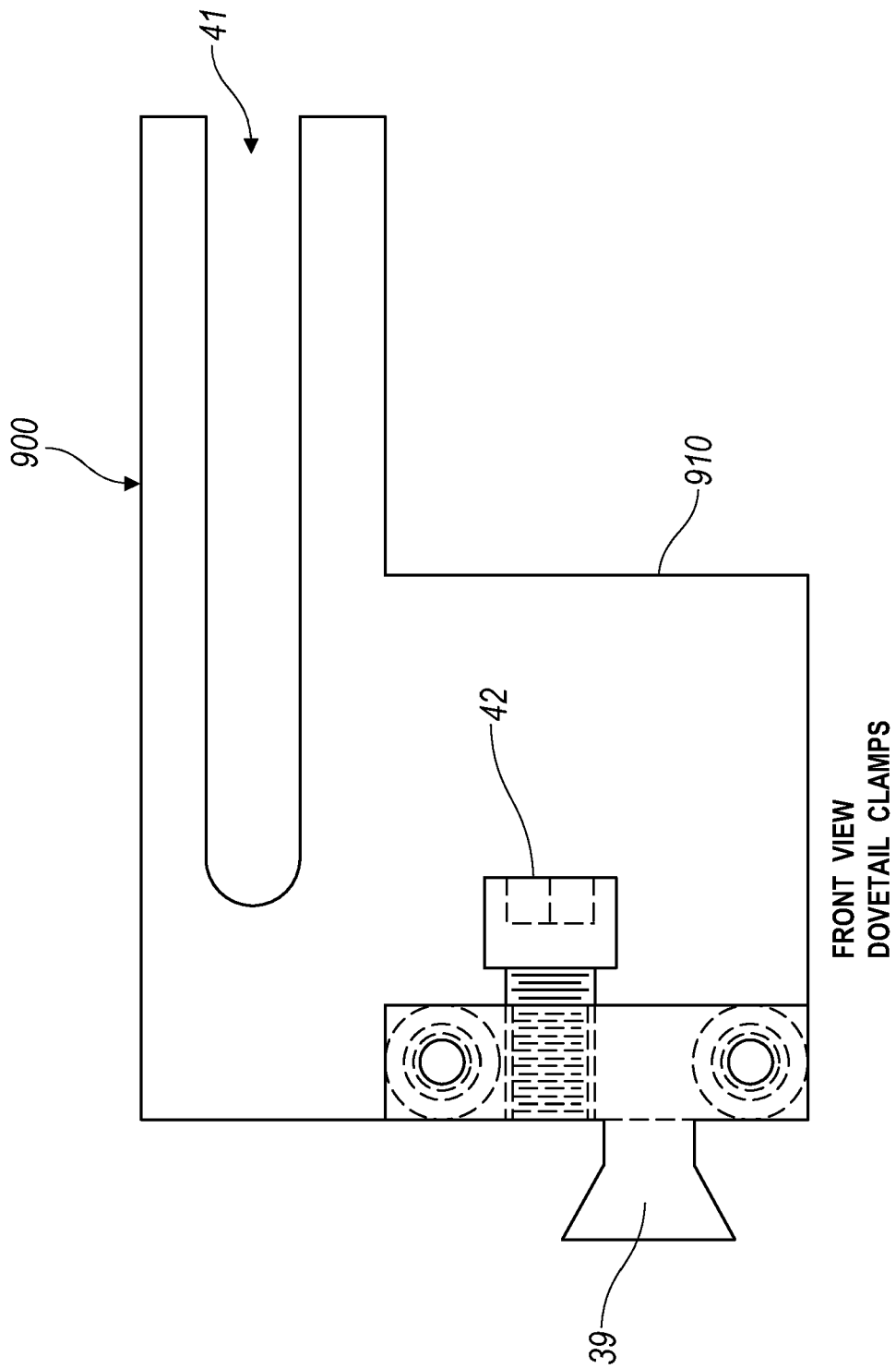
FIG. 11 is a side view of a dovetail clamping bracket in accordance with the present invention.
Figure 12:
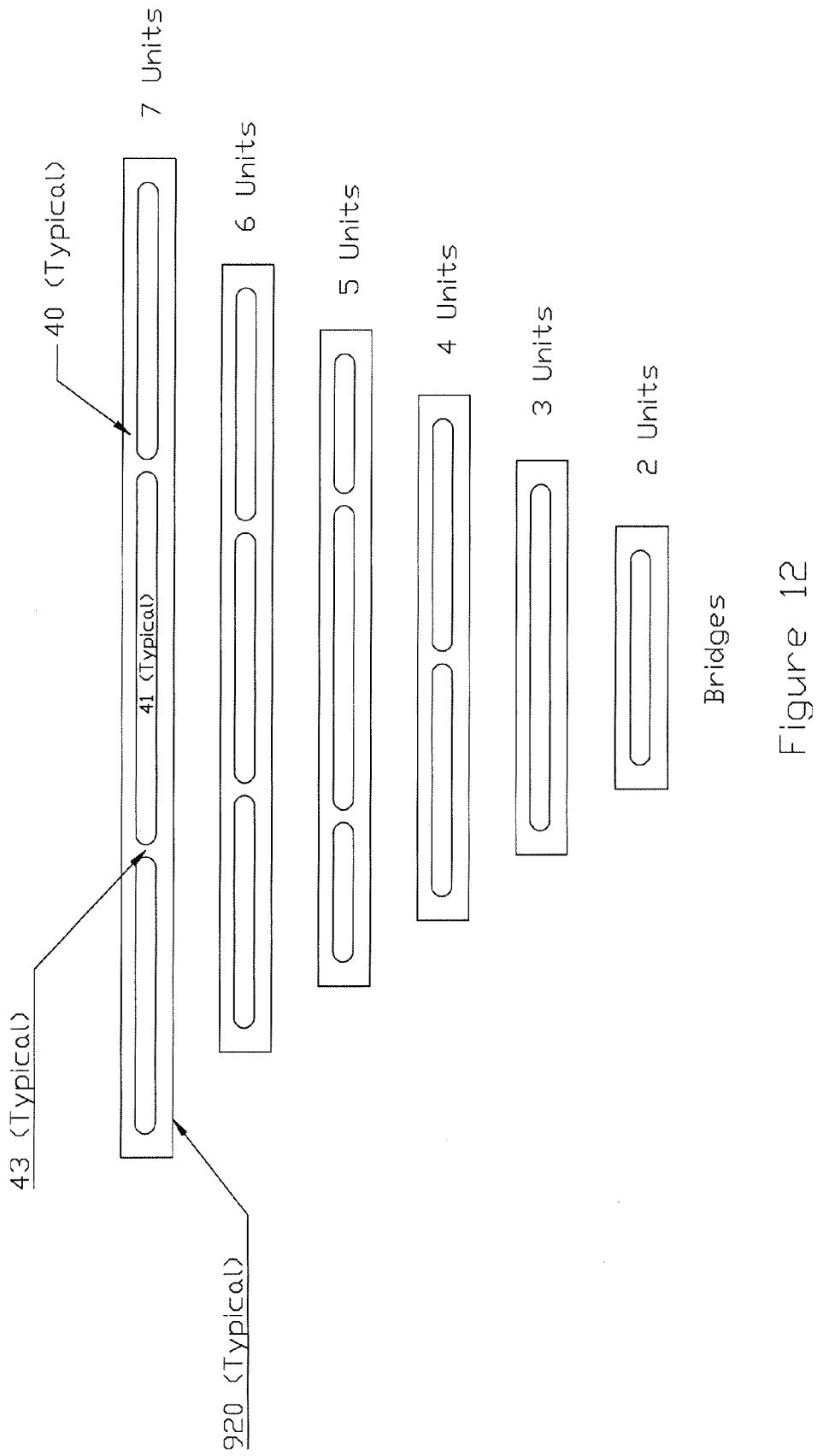
FIG. 12 is a top view of a plurality of bridge members in accordance with the present invention.

Reference is now made to FIGS. 10 through 12, which illustrate a vacuum box 100 having a front rail 3, a rear rail 4, a left-front side plate 800, a left-rear side plate 810, a plurality of substrate support devices 840, and a pair of dovetail clamp brackets 900. As shown in FIG. 11, the dovetail clamp bracket 900 has a dovetail boss 39 that is configured for operative engagement within a dovetail recess 38 formed within the front and/or rear rail 3 and 4 (see FIGS. 2a, 2b, 3a and 3b); a set screw 42 for positionally securing the dovetail clamp bracket within the dovetail recess 38. The dovetail clamp bracket 900 also has a plate 910 attached to the dovetail boss 39. The plate 910 has a slot 41 for receiving a mechanical fastener there through.

In operation, the dovetail clamp brackets 900 are inserted into the dovetail recesses 38 of the front and rear rails 3 and 4, as shown in FIG. 10. The dovetail clamp brackets 900 are positioned with the plates 910 adjacent to the end of one or more substrate support devices 840 such that the slot 41 is aligned with one or more threaded cavities 840a formed on the substrate support devices 840. The dovetail clamp brackets 900 are locked in place by engaging the setscrew 42, which binds the dovetail boss 39 within the dovetail recess 38. Next, a mechanical fastener 905 such as a bolt or screw is passed through the slot 41 and operatively engaged with the threaded cavity 840a of the substrate support device 840. It is contemplated that other mechanical fasteners 905 may be used such as thumbscrews, spring-loaded pins, Allen head screws or other fasteners that releasably retain components. Thru use of the dovetail clamping bracket 900, the substrate support device 840 is mechanically secured to the vacuum box assembly.

In the event, that the number of substrate support devices 840 extend beyond slot 41 formed within the dovetail clamp bracket 900, a bridge member 920 may be added to the assembly. The bridge member 920 is provided in various lengths that correspond with the widths of the PCBs, see FIG. 12. The bridge members 920 are configured to retain from two to several substrate support devices 840. The bridge members 920 have slots 41 as described above as well as structural webbing 43 to provide strength and prevent distortion of the bridge member during use. The bridge members 920 are positioned adjacent to the slot 41 in the dovetail clamp bracket 900 and mechanical fastening members are passed through the slots 41 in the bridge member 920 to threadably engage the substrate support devices 840.

In another exemplary embodiment, the side plates may be configured to secure the automated substrate support devices using a magnetic bond between the side plate and the substrate support device. The automated substrate support devices generally utilize an electro-mechanical, hydraulic or pneumatic configuration to retain the support pins in place. As a result, there is minimal external force applied to the substrate support device, which could shift or move the device with respect to placement within the side plate/vacuum box assembly.

Figure 13A:
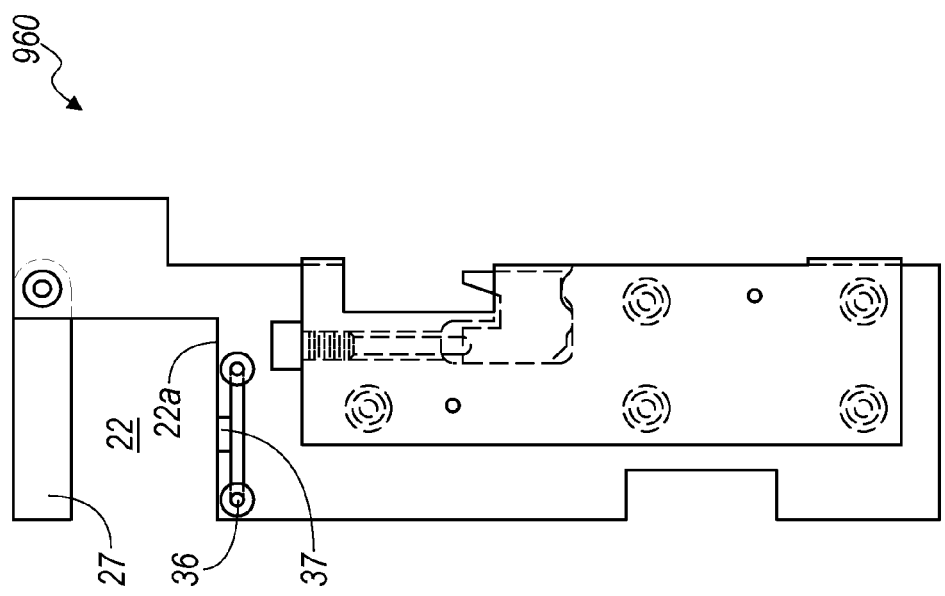
FIG. 13a is a side view of an alternate embodiment of a side plate in accordance with the present invention.
Figure 13B:
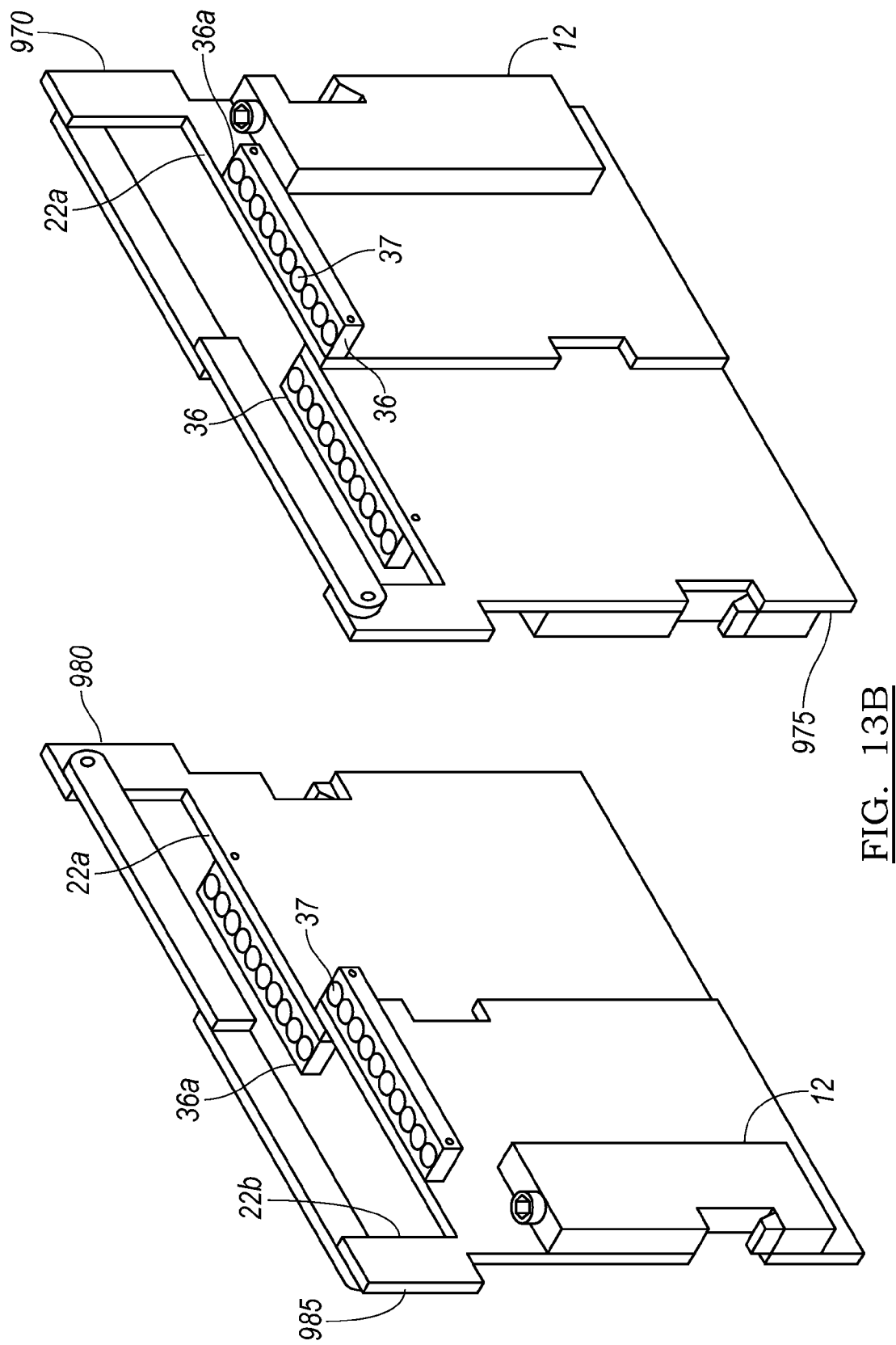
FIG. 13b is an isometric view of two sets of side plates in accordance with one embodiment of the present invention.

Reference is now made to FIGS. 13a and 13b, which illustrate another embodiment for the left-front side plate 960. In accordance with this alternate embodiment, the majority of the left-front side plate 960 is similar to the previously described left-front side plate 800 and like structure is not repeated here to avoid undue prolixity. However, this embodiment of side plate 960 adds a small support shelf 36, which extends perpendicularly away from the side plate 960, see FIG. 13b. The support shelf 36 is either integrally formed with the side plate 960 or comprises a separate component structurally attached to the side plate 960 by way of fasteners, screws, press-fit connectors, and/or adhesives. The support shelf 36 has an upper surface 36a that is flush with the bottom cavity edge 22a such that a flat planar surface is formed upon which one or more substrate support devices may rest. The support shelf 36 is further configured with one or more magnets 37 that are attached to the shelf by mechanical means such as press fit, adhesives or a combination of both. However, it is contemplated that other attachments are possible and would be readily appreciated and understood by one of ordinary skill in the art subsequent to reviewing this disclosure.

FIG. 13b illustrates two sets of extra-large side plates arranged in sliding relationship with one another. As illustrated, there is a left-front side plate 970, a left-rear side plate 975, a right-front side plate 980 and a right-rear side plate 985. The extra-large side plates 970, 975, 980, and 985 have been configured to retain and support one to ten substrate support devices and correspondingly have a width that is greater than the small side plate 960 of FIG. 9a.

Figure 13C:
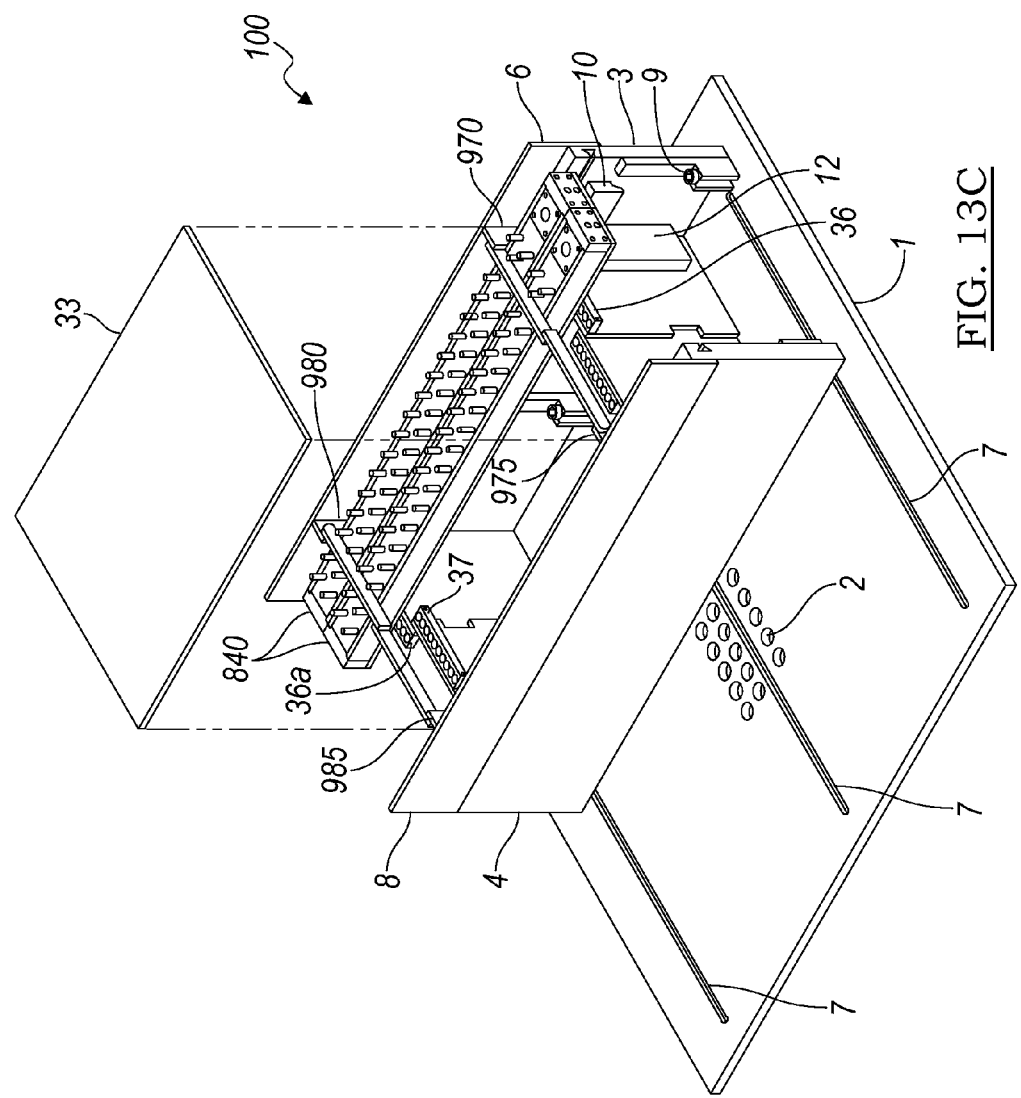
FIG. 13c is an isometric view of one embodiment of a vacuum box assembly in accordance with the present invention.

Reference is now made to FIG. 13c, which is an isometric view illustrating a vacuum box 100 having a front rail 3, a rear rail 4, a left-front side plate 970, a left-rear side plate 975, a right-front side plate 980, a right-rear side plate 985, a substrate support device 840 and a clamping block 12 affixed to each side plates 970, 975, 980, 985. The side plates 970, 975, 980, and 985 incorporate the support shelf 36 and magnet 37 of the alternate embodiment. As illustrated, the substrate support devices 840 are retained by magnetic force which is produced by the magnets 37 and physically couples the substrate support devices 840 with the support shelf 36 and side plates.

In the event that the substrate support device retention cavity 22 is not completely occupied with substrate support devices 840, a substantial vacuum leak may be present. For example, when a medium side plate is installed into the vacuum box and only one substrate support device is positioned within the vacuum box. This would leave an unblocked portion of the retention cavity 22 that would cause a vacuum leak.

In response to this situation, one or more vacuum blocking plates 44 may be installed to seal the unoccupied portion of the retention cavity 22. Reference is made to FIG. 10, which illustrates an installation of vacuum blocking plates 44. Additionally, an exemplary vacuum blocking plate is illustrated in FIGS. 14a and 14b. The vacuum blocking plate 44 is configured in various widths to accommodate various unoccupied regions in the retention cavity 22. The vacuum blocking plate 44 may have a magnet 45 applied to all or half of the plate. The magnet 45 may be configured to provide clearance for the retention member 27 of the side plate. Furthermore, the vacuum blocking plate may have a notch 47 formed there on to accommodate the support shelf 36 of the alternate embodiment. In use, the vacuum blocking plate 44 is positioned on the side plate to substantially cover the unoccupied portion of the retention cavity. The vacuum blocking plate 44 is held in place by the magnet 45, which adheres to the side plate by way of magnetic force bonding the vacuum blocking plate 44 with the side plate.

The invention provides several advantages not found in known printed circuit board/substrate support assemblies. For example, the present invention enables the use of standard commercially available substrate support devices within commonly used vacuum box assemblies. Consequently, common off-the-shelf substrate support devices may be implemented more frequently, thus increasing manufacturing efficiencies. The present invention also reduces manufacturing costs by avoiding the need to use custom designed or modified substrate support devices within a typical vacuum box assembly.

Although the above provides a full and complete disclosure of the preferred embodiments of the invention, various modifications, alternate constructions and equivalents will occur to those skilled in the art. For example, although the invention has been described with reference to a rivet, other types of connections between the side plate and retention member can be utilized as desired. Moreover, different types of removable fasteners can be used between the support shelf and the substrate support device to practice the invention. Additionally, the side plate may be either removable or may be permanently attached to the clamping block. Therefore, the above should not be construed as limiting the invention, which is defined by the claims.

What is claimed is:

1. An apparatus for assembling printed circuit boards, including:

a first support plate having an inner face and an outer face, the first support plate having a first attachment rail disposed horizontally on its inner face and running substantially from a first edge to a second edge of the first support plate at a selected height above a bottom edge of the first side plate, an inner surface of the first attachment rail and the inner face of the first support rail defining a first side-plate attachment channel running substantially from the first edge to the second edge of the first support plate;

a second support plate spaced apart from the first support plate and having an inner face and an outer face, the second support plate having a second attachment rail disposed horizontally on its inner face and running substantially from a first edge to a second edge of the second support plate at a selected height above a bottom edge of the second side plate, an inner surface of the second attachment rail and the inner face of the second support rail defining a second side-plate attachment channel running substantially from the first edge to the second edge of the second support plate;

a first side plate oriented perpendicular to the first and second support plates, the first side plate having a top edge with a height less than the height of the first and second support plates and having a first recess on a first edge that mates with the first attachment rail and a biased member that engages the first side-plate attachment channel, and a second recess on a second edge that mates with the second side-plate attachment channel and a biased member that engages the second side-plate attachment rail;

a second side plate oriented perpendicular to the first and second support plates, the second side plate having a top edge with a height equal to the height of the first side plate and having a first recess on a first edge that mates with the first attachment rail and a biased member that engages the first side-plate attachment channel, and a second recess on a second edge that mates with the second side-plate attachment channel and a biased member that engages the second side-plate attachment rail, the first and second support plates and the first and second side plates forming a vacuum box; and at least one substrate support device having a height less than the difference between the height of the first and second side plates and the first and second support plates, and resting on the top edges of the first and second side plates.

2. The apparatus of claim 1, further including a vacuum baffle pivotally mounted at an upper edge of each of the first and second die plates, each vacuum baffle having a height substantially equal to the difference between the height of a substrate support device and the height of the first and second support plates.

3. The apparatus of claim 1, wherein each of the first and second side plates comprises a pair of overlapping sections slideably mounted to one another to adjust their overall width.

4. The apparatus of claim 1 wherein the substrate support device comprises a plurality of displaceable pins, the pins being movable with respect to the substrate support device and retainable in a preset position.

5. The apparatus of claim 1 further comprising a retention member movably coupled to the side plate, the retention member comprising a first end, a second end, a top edge, a bottom edge, the first end of the retention member coupled to the side plate adjacent to the top edge of the side plate and wherein the top edge of the retention member is substantially even with the top edge of the side plate.

6. The apparatus of claim 1 further comprising a clamping block releasably coupled to the side plate.

7. The apparatus of claim 1 further comprising a support shelf extending perpendicularly away from the side plate, the support shelf positioned substantially even with the top edge of the side plate.

8. The apparatus of claim 7 further comprising at least one magnet coupled to the support shelf.

9. The apparatus of claim 1 wherein the retention member is removably coupled to the side plate.

10. The apparatus of claim 1 wherein the first and second side plates each have a width substantially equal to a multiple of a width of a substrate support device.

* * * * *